(12) United States Patent
Yumoto et al.

(10) Patent No.: US 8,081,285 B2
(45) Date of Patent: Dec. 20, 2011

(54) MOUNTING STRUCTURE MOUNTING SUBSTRATE, ELECTRO-OPTICAL DEVICE, AND ELECTRONIC APPARATUS

(75) Inventors: Masanori Yumoto, Nagano (JP); Yoshihisa Hirano, Nagano (JP)

(73) Assignee: Seiko Epson Corporation (JP)

( * ) Notice: Subject to any disclaimer, the term of this patent is extended or adjusted under 35 U.S.C. 154(b) by 1003 days.

(21) Appl. No.: 11/227,018

(22) Filed: Sep. 15, 2005

(65) Prior Publication Data

US 2006/0065437 A1 Mar. 30, 2006

(30) Foreign Application Priority Data

Sep. 28, 2004 (JP) ................................. 2004-281121

(51) Int. Cl.
*G02F 1/1345* (2006.01)
(52) U.S. Cl. ......... 349/152; 349/149; 349/150; 349/151
(58) Field of Classification Search .......... 349/149–152; 359/254
See application file for complete search history.

(56) References Cited

U.S. PATENT DOCUMENTS

| | | | | |
|---|---|---|---|---|
| 5,686,703 | A * | 11/1997 | Yamaguchi | 174/259 |
| 6,444,923 | B1 * | 9/2002 | Iriguchi et al. | 174/261 |
| 2002/0044329 | A1 * | 4/2002 | Shoji | 359/245 |
| 2004/0085504 | A1 * | 5/2004 | Kim et al. | 349/149 |
| 2004/0238827 | A1 * | 12/2004 | Takayama et al. | 257/79 |

FOREIGN PATENT DOCUMENTS

| | | |
|---|---|---|
| JP | 61-88136 | 6/1986 |
| JP | 7-17162 | 4/1995 |
| JP | 08-070167 | 3/1996 |
| JP | 08070167 A * | 3/1996 |
| JP | 09-275257 | 10/1997 |
| JP | 2000-235354 | 8/2000 |
| JP | 2000235354 A * | 8/2000 |
| JP | 2002-140016 | 5/2002 |
| JP | 2002-207222 | 7/2002 |
| JP | 2005-115337 | 4/2005 |

* cited by examiner

*Primary Examiner* — Jessica M Merlin
(74) *Attorney, Agent, or Firm* — Harness, Dickey & Pierce, P.L.C.

(57) ABSTRACT

A mounting structure includes a first substrate that has a first surface and a second surface, a plurality of first connection terminals that are disposed on the first surface in a first direction, a plurality of second connection terminals that are disposed on the first surface in a second direction perpendicular to the first direction and that are disposed at predetermined gaps from the first connection terminals, a plurality of connection wiring lines that are disposed on the second surface, each having first portions that overlap the first and second connection terminals in plan view and a second portion that is formed to have a width narrower than those of the first and second connection terminals in the first direction, a plurality of through holes that pass through the first substrate so as to correspondingly connect the second connection terminals to the connection wiring lines, and a second substrate that has a plurality of third connection terminals correspondingly connected to the first and second connection terminals and correspondingly overlap the first and second connection terminals in plan view.

8 Claims, 10 Drawing Sheets

# MOUNTING STRUCTURE MOUNTING SUBSTRATE, ELECTRO-OPTICAL DEVICE, AND ELECTRONIC APPARATUS

BACKGROUND OF THE INVENTION

1. Technical Field

The present invention relates to a mounting structure which has two substrates electrically connected to each other, to a mounting substrate, to an electro-optical device, and to an electronic apparatus using such an electro-optical device.

2. Related Art

An electro-optical device, for example, a liquid crystal device of a COG (Chip on Glass) method, includes a liquid crystal panel in which liquid crystal is sealed between a pair of substrates, a semiconductor element that is mounted on a substrate of the liquid crystal panel, a flexible wiring board that is electrically connected to the semiconductor element, and a circuit board that supplies signals to the liquid crystal panel via the flexible wiring board and the semiconductor element. In this case, connection terminals, which are respectively provided on the flexible wiring board and the circuit board as electrode patterns, are electrically connected to each other through an ACF (Anisotropic Conductive Film), and then the flexible wiring board and the circuit board are connected to each other. The electrode pattern is arranged, for example, in a zigzag shape (for example, see Japanese Unexamined Patent Application Publication No. 8-70167 (paragraphs [0013] to [0015] and FIG. 1)).

However, in the liquid crystal device having the above-described configuration, the connection terminals are arranged in the zigzag shape in a plurality of lines, and thus the adhesion area region of the flexible wiring board and the circuit board can be reduced, as compared with the case in which the connection terminals are arranged in a line, but there is a problem in that the adhesion area region cannot be sufficiently ensured. Further, the inspection for a positional deviation of the connection terminals on the flexible wiring board and the connection terminals of the circuit board cannot be easily performed. In addition, whether or not there are connection defects of the flexible wiring board and the circuit board needs be checked with the naked eye or the like. For this reason, there is a problem in that work efficiency may be degraded.

SUMMARY

An advantage of the invention is that it provides a mounting structure that can further reduce an electrical adhesion area of two substrates and can easily perform an inspection for a positional deviation between connection terminals provided on two substrates, a mounting substrate, an electro-optical device, and an electronic apparatus using such an electro-optical device.

According to a first aspect of the invention, a mounting structure includes a first substrate that has a first surface and a second surface, a plurality of first connection terminals that are disposed on the first surface in a first direction, a plurality of second connection terminals that are disposed on the first surface in a second direction perpendicular to the first direction and that are disposed at predetermined gaps from the first connection terminals, a plurality of connection wiring lines that are disposed on the second surface, each having first portions that overlap the first and second connection terminals in plan view and a second portion that is formed to have a width narrower than those of the first and second connection terminals in the first direction, a plurality of through holes that pass through the first substrate so as to correspondingly connect the second connection terminals to the connection wiring lines, and a second substrate that has a plurality of third connection terminals being connected to the first and second connection terminals and correspondingly overlapping the first and second connection terminals in plan view.

According to such a configuration, the first and second connection terminals are provided in the second direction, not in a zigzag shape, and the connection wiring line is provided to overlap the first and second connection terminals. Further, the second connection terminals are electrically connected to the connection wiring lines. Therefore, a conductive pattern electrically connected to the first connection terminals can be provided on the first surface and a conductive pattern electrically connected to, the second connection terminals can be provided on the second surface. That is, the conductive patterns can be provided on separate surfaces. Therefore, more connection terminals can be provided in the same area, as compared with the case in which the connection terminals are provided in the zigzag shape. Specifically, in a case in which a same number of connection terminals are provided, it is possible to reduce the connection area of the first substrate and the second substrate. Further, on the first substrate, the connection wiring line overlaps the first and second connection terminals in plan view, and at least a portion (the second portion) of the connection wiring line has a width narrower than that of each of the first and second connection terminals. Therefore, after the first substrate and the second substrate are connected to each other, an inspection for a positional deviation of both substrates, that is, an inspection for connection defects of the first and second connection terminals and the third connection terminal, can be easily performed. For example, it is assumed that the first substrate and the second substrate have higher transmittance than the first connection terminal, the second connection terminal, the third connection terminal and the connection wiring line. More specifically, it is assumed that the first substrate and the second substrate have light transmissive properties, while the first connection terminal, the second connection terminal, the third connection terminal, and the connection wiring line have light-shielding properties. In this case, the inspection for a positional deviation can be performed by irradiating light onto the mounting structure from one side thereof and observing transmitted light from the other side thereof. If doing so, it can be observed that light passes through in a region where only the first substrate exists, a region where only the second substrate exists, or a region where only the first substrate and the second substrate overlap. On the other hand, it can be observed that light is shielded in a region where at least one of the first, second and third connection terminals and the connection wiring line exists. Then, the pattern shape of the light shielding region can be visually recognized through brightness of the light transmission region and the light shielding region. Then, only in a case in which the pattern shape of the light shielding region has a narrow portion and a plurality of patterns disposed in the first direction are separated from each other to have independent shapes, without contacting each other, it can be judged that there are no connection defects. In such a manner, the positional deviation and the connection defects can be easily judged by visually recognizing the pattern shape of the light shielding region, specifically, by visually recognizing how the shape in the vicinity of a narrow portion formed by the first portions and the second portion of the connection wiring line is observed. Therefore, manufacturing efficiency of the mounting structure can be enhanced and a mounting structure having stable quality with no connection defects can be easily obtained. Further, in a case in which a light transmissive property is bad since the second substrate is of a four-layered substrate structure or the like, the inspection for a positional deviation can be performed by reflection. Specifically, light may be irradiated onto the mounting structure from a first substrate side, and a difference in intensity (color difference) of reflected light by the connection wiring line and reflected light by the third connection terminal may be observed. That is, when the first substrate and the second substrate are connected to each other with no positional deviation, the first portions of the connection wiring line completely overlap the third connection terminal in plan view, such that only reflected light by the connection wiring line is observed, that is, reflected light having a kind of light intensity is observed. On the other hand, in a case in which the first substrate and the second substrate are connected to each other with the positional deviation, both of reflected light by the connection wiring line and reflected light by the third connection terminal are observed, that is, reflected light of two kinds of light intensity is observed. In such a manner, the inspection for a positional deviation can be performed by use of reflected light, and thus it is possible to judge whether or not the connection defects exist through the pattern shape of reflected light to be observed. Further, in a case of the inspection by use of reflected light, the first substrate and an adhesive, such as the ACF connecting the first substrate and the second substrate, must have the light transmissive properties. At this time, even when the second substrate does not have the light transmissive property, the inspection can be performed unlimitedly.

Further, it is preferable that the first substrate and the second substrate have light transmittance higher than those of the first connection terminals, the second connection terminals, the third connection terminals, and the connection wiring lines.

According to such a configuration, the inspection of a positional deviation of the first substrate and the second substrate can be performed by irradiating light onto a region, in which the first substrate and the second substrate of the mounting structure overlap, from one side thereof, and by observing transmitted light from the other side. If doing so, it can be observed that, in a region where at least one of the first, second, and third connection terminals and the connection wiring line exists, and a region where none of them does not exist, brightness can be recognized with different light transmission, and thus the pattern shape formed in plan view by the first, second, and third connection terminals and the connection wiring line can be recognized as a dark pattern shape. Then, only in a case in which the pattern shape has a narrow portion and a plurality of patterns disposed in the first direction does not come in contact with each other, but are separated from each other to have independent shapes, it can be judged that there are no connection defects. The positional deviation and the connection defects can be easily judged by visually recognizing the pattern shape formed by the first, second, and third connection terminals and the connection wiring line in plan view. Therefore, manufacturing efficiency of the mounting structure can be enhanced and a mounting structure of stable quality with no connection defects can be easily obtained.

Further, it is preferable that the first and second connection terminals and the third connection terminals be correspondingly connected by light-transmissive conductive members.

In such a manner, the light-transmissive conductive member, in which conductive particles are dispersed in light-transmissive resin, can be used. Therefore, for example, when the inspection for a positional deviation is performed by light irradiation, the inspection for a positional deviation can be easily performed, without causing light to be shielded by the conductive member.

According to a second aspect of the invention, a mounting structure includes a first substrate that has a first surface and a second surface, a plurality of first connection terminals that are disposed on the first surface in a first direction, a plurality of second connection terminals that are located on the first surface in a second direction perpendicular to the first direction and are disposed at predetermined gaps from the first connection terminals, a plurality of connection wiring lines that are disposed on the second surface, each having first portions that substantially overlap the first and second connection terminals in plan view and are formed smaller than the first and second connection terminals in plan view, and a second portion that is formed to have a width narrower than those of the first portions in the first direction, a plurality of through holes that pass through the first substrate so as to correspondingly connect the second connection terminals to the connection wiring lines, and a second substrate that has a plurality of third connection terminals being connected to the first and second connection terminals and correspondingly overlap the first and second connection terminals in plan view.

According to such a configuration, the first and second connection terminals are provided along the second direction, not in a zigzag shape, and the connection wiring line is provided to overlap the first and second connection terminals. Further, the second connection terminals are electrically connected to the connection wiring lines. Therefore, a conductive pattern electrically connected to the first connection terminals can be provided on the first surface and a conductive pattern electrically connected to the second connection terminals can be provided on the second surface. That is, the conductive patterns can be provided on separate surfaces. Therefore, more connection terminals can be provided in the same area, as compared with the case in which the connection terminals are provided in the zigzag shape. Specifically, in a case in which a same number of connection terminals are provided, it is possible to reduce the connection area of the first substrate and the second substrate. Further, the first and second connection terminals are formed larger than the first portions of the connection wiring line, and thus it is possible to reduce the connection defects between the third connection terminals of the second substrate and the first and second connection terminals caused by the positional deviation when the first and second substrates are mounted. Further, on the first substrate, the connection wiring line overlaps the first connection terminal and the second connection terminal in plan view, and at least a portion of the connection wiring line has a narrow portion formed by the first portions and the second portion. Therefore, after the first substrate and the second substrate are connected to each other, the inspection for a positional deviation of both substrates, that is, the inspection for connection defects of the first and second connection terminals and the third connection terminal, can be easily performed. That is, for example, it is assumed that the first substrate and the second substrate have higher light transmittance than those of the first connection terminal, the second connection terminal, the third connection terminal, and the connection wiring line. More specifically, it is assumed that the first substrate and the second substrate have light transmissive properties, while the first connection terminal, the second connection terminal, the third connection terminal, and the connection wiring line have light-shielding properties. In this case, the inspection for a positional deviation can be performed by irradiating light onto the mounting structure from one side thereof and by observing transmitted light from the other side thereof. If doing so, it can be observed that light passes through in a region where only the first substrate exists, a region where only the second substrate exists, or a region where only the first substrate and the second substrate overlap. On the other hand, it can be observed that light is shielded in a region where at least one of the first, second and third connection terminals and the connection wiring line exists. Then, the pattern shape of the light shielding region can be visually recognized through brightness of the light transmission region and the light shielding region. Then, only in a case in which the pattern shape of the light shielding region has a narrow portion having a narrow width (which corresponds to a narrow portion of the connection wiring line) and a plurality of patterns disposed in the first direction are separated from each other to have independent shapes, without contacting each other, it can be judged that there are no connection defects. In such a manner, the positional deviation and the connection defects can be easily judged by visually recognizing the pattern shape of the light shielding region, specifically, by visually recognizing how the shape in the vicinity of a narrow portion formed by the first portions and the second portion of the connection wiring line is observed. Therefore, manufacturing efficiency of the mounting structure can be enhanced and a mounting structure having stable quality with no connection defects can be easily obtained. Further, in a case in which a light transmissive property is bad since the second substrate is of a four-layered substrate structure or the like, the inspection for a positional deviation can be performed by reflection. Specifically, when light is irradiated onto the mounting structure from a first substrate side, it is possible to judge whether or not the connection defects exist through the pattern shape of reflected light by the connection wiring line, the first, second, and third connection terminals. Further, in a case of the inspection by use of reflected light, the first substrate and an adhesive, such as the ACF connecting the first substrate and the second substrate, must have the light transmissive properties. At this time, even when the second substrate does not have the light transmissive property, the inspection can be performed unlimitedly.

According to a third aspect of the invention, a mounting structure includes a first substrate that has a first surface and a second surface, a plurality of first connection terminals that are disposed on the first surface in a first direction, a plurality of second connection terminals that are disposed on the first surface in a second direction perpendicular to the first direction and are disposed at predetermined gaps from the first connection terminals, a plurality of connection wiring lines that are disposed on the second surface, each having first portions that substantially overlap the first and second connection terminals in plan view and are formed larger than the first and second connection terminals in plan view, and a second portion that is formed to have a width narrower than those of the first and second connection terminals in the first direction, a plurality of through holes that pass through the first substrate so as to correspondingly connect the second connection terminals to the connection wiring lines, and a second substrate that has a plurality of third connection terminals being connected to the first and second connection terminals and correspondingly overlap the first and second connection terminals in plan view.

According to such a configuration, the first and second connection terminals are provided in the second direction, not in a zigzag shape, and the connection wiring line is provided to overlap the first and second connection terminals. Further, the second connection terminals are electrically connected to the connection wiring lines. Therefore, a conductive pattern electrically connected to the first connection terminals can be provided on the first surface and a conductive pattern electrically connected to the second connection terminals can be provided on the second surface. That is, the conductive patterns can be provided on separate surfaces. Therefore, more connection terminals can be provided in the same area, as compared with the case in which the connection terminals are provided in the zigzag shape. Specifically, in a case in which a same number of connection terminals are provided, it is possible to reduce the connection area of the first substrate and the second substrate. Further, on the first substrate, the connection wiring line overlaps the first and second connection terminals in plan view, and at least a portion of the connection wiring line has a narrow portion formed by the first portions and the second portion. Therefore, after the first substrate and the second substrate are connected to each other, the inspection for a positional deviation of both substrates, that is, the inspection for connection defects of the first and second connection terminals and the third connection terminal, can be easily performed. For example, it is assumed that the first substrate and the second substrate have higher transmittance than the first connection terminal, the second connection terminal, the third connection terminal and the connection wiring line. More specifically, it is assumed that the first substrate and the second substrate have light transmissive properties, while the first connection terminal, the second connection terminal, the third connection terminal, and the connection wiring line have light-shielding properties. In this case, the inspection for a positional deviation can be performed by irradiating light onto the mounting structure from one side thereof and observing transmitted light from the other side thereof. If doing so, it can be observed that light passes through in a region where only the first substrate exists, a region where only the second substrate exists, or a region where only the first substrate and the second substrate overlap. On the other hand, it can be observed that light is shielded in a region where at least one of the first, second and third connection terminals and the connection wiring line exists. Then, the pattern shape of the light shielding region can be visually recognized through brightness of the light transmission region and the light shielding region. Then, only in a case in which the pattern shape of the light shielding region has a narrow portion having a narrow width (which corresponds to a narrow portion of the connection wiring line) and a plurality of patterns disposed in the first direction are separated from each other to have independent shapes, without contacting each other, it can be judged that there are no connection defects. In such a manner, the positional deviation and the connection defects can be easily judged by visually recognizing the pattern shape of the light shielding region, specifically, by visually recognizing how the shape in the vicinity of a narrow portion formed by the first portions and the second portion of the connection wiring line is observed. Therefore, manufacturing efficiency of the mounting structure can be enhanced and a mounting structure having stable quality with no connection defects can be easily obtained. Further, in a case in which a light transmissive property is bad since the second substrate is of a four-layered substrate structure or the like, the inspection for a positional deviation can be performed by reflection. Specifically, light may be irradiated onto the mounting structure from a first substrate side, and a difference in intensity (color difference) of reflected light by the connection wiring line and reflected light by the third connection terminal may be observed. That is, when the first substrate and the second substrate are connected to each other with no positional deviation, the first portions of the connection wiring line completely overlap the third connection terminal in plan view, such that only reflected light by the connection wiring line is observed, that is, reflected light having a kind of light intensity is observed. On the other hand, in a case in which the first substrate and the second substrate are connected to each other with the positional deviation, both of reflected light by the connection wiring line and reflected light by the third connection terminal are observed, that is, reflected light of two kinds of light intensity is observed. In such a manner, the inspection for a positional deviation can be performed by use of reflected light, and thus it is possible to judge whether or not the connection defects exist through the pattern shape of reflected light to be observed. Here, the first portions of the connection wiring line are formed larger than the first and second connection terminals in plan view, and thus, when observing the first substrate in plan view, the first and second connection terminals completely overlap the connection wiring line and cannot be observed by the connection wiring line. Therefore, at the time of the inspection for a positional deviation by use of reflected light, two kinds of reflected light by the connection wiring line and reflected light by the third connection terminal are simply observed, and thus the inspection can be easily performed, as compared to the case in which three or more kinds of reflected light are observed. Further, in a case of the inspection by use of reflected light, the first substrate and an adhesive, such as the ACF connecting the first substrate and the second substrate, must have the light transmissive properties. At this time, even when the second substrate does not have the light transmissive property, the inspection can be performed unlimitedly.

According to a fourth aspect of the invention, a mounting substrate includes a first substrate that has a first surface and a second surface, a plurality of first connection terminals that are disposed on the first surface in a first direction, a plurality of second connection terminals that are disposed on the first surface in a second direction perpendicular to the first direction and are disposed at predetermined gaps from the first connection terminals, a plurality of connection wiring lines that are disposed on the second surface, each having first portions that overlap the first and second connection terminals in plan view and a second portion that is formed to have a width narrower than those of the first and second connection terminals in the first direction, and a plurality of through holes that pass through the first substrate so as to correspondingly connect the second connection terminals to the connection wiring lines.

According to such a configuration, the first and second connection terminals are provided in the second direction, not in a zigzag shape, and the connection wiring line is provided to overlap the first and second connection terminals. Further, the second connection terminals are electrically connected to the connection wiring lines. Therefore, a conductive pattern electrically connected to the first connection terminals can be provided on the first surface and a conductive pattern electrically connected to the second connection terminals can be provided on the second surface. That is, the conductive patterns can be provided on separate surfaces. Therefore, more connection terminals can be provided in the same area, as compared with the case in which the connection terminals are provided in the zigzag shape. Specifically, in a case in which a same number of connection terminals are provided, it is possible to reduce the mounting substrate. Further, in the mounting substrate according to the fourth aspect of the invention, the connection wiring line overlaps the first and second connection terminals in plan view, and at least a portion (the second portion) of the connection wiring line has a width narrower than that of each of the first and second connection terminals. Therefore, when the mounting substrate and the second substrate having the third connection terminals are connected to each other, and the first and second connection terminals and the third connection terminal are connected to each other, for example, after the connection, the inspection for a positional deviation of both substrates and the inspection for connection defects of the first and second connection terminals and the third connection terminal can be easily performed. For example, it is assumed that the first substrate and the second substrate have higher transmittance than the first connection terminal, the second connection terminal, the third connection terminal and the connection wiring line. More specifically, it is assumed that the first substrate and the second substrate have light transmissive properties, while the first connection terminal, the second connection terminal, the third connection terminal, and the connection wiring line have light-shielding properties. In this case, the inspection for a positional deviation can be performed by irradiating light onto the mounting structure from one side thereof and observing transmitted light from the other side thereof. If doing so, it can be observed that light passes through in a region where only the first substrate exists, a region where only the second substrate exists, or a region where only the first substrate and the second substrate overlap. On the other hand, it can be observed that light is shielded in a region where at least one of the first, second and third connection terminals and the connection wiring line exists. Then, the pattern shape of the light shielding region can be visually recognized through brightness of the light transmission region and the light shielding region. Then, only in a case in which the pattern shape of the light shielding region has a narrow portion and a plurality of patterns disposed in the first direction are separated from each other to have independent shapes, without contacting each other, it can be judged that there are no connection defects. In such a manner, the positional deviation and the connection defects can be easily judged by visually recognizing the pattern shape of the light shielding region, specifically, by visually recognizing how the shape in the vicinity of a narrow portion formed by the first portions and the second portion of the connection wiring line is observed. Further, in a case in which a light transmissive property is bad since the second substrate is of a four-layered substrate structure or the like, the inspection for a positional deviation can be performed by reflection. Specifically, light may be irradiated from a first substrate side, and a difference in intensity (color difference) of reflected light by the connection wiring line and reflected light by the third connection terminal may be observed. That is, when the first substrate and the second substrate are connected to each other with no positional deviation, the first portions of the connection wiring line completely overlap the third connection terminal in plan view, such that only reflected light by the connection wiring line is observed, that is, reflected light having a kind of light intensity is observed. On the other hand, in a case in which the first substrate and the second substrate are connected to each other with the positional deviation, both of reflected light by the connection wiring line and reflected light by the third connection terminal are observed, that is, reflected light of two kinds of light intensity is observed. In such a manner, the inspection for a positional deviation can be performed by use of reflected light, and thus it is possible to judge whether or not the connection defects exist through the pattern shape of reflected light to be observed. Further, in a case of the inspection by use of reflected light, the first substrate and an adhesive, such as the ACF connecting the first substrate and the second substrate, must have the light transmissive properties. At this time, even when the second substrate does not have the light transmissive property, the inspection can be performed unlimitedly.

According to a fifth aspect of the invention, a mounting substrate includes a first substrate that has a first surface and a second surface, a plurality of first connection terminals that are disposed on the first surface in a first direction, a plurality of second connection terminals that are disposed on the first surface in a second direction perpendicular to the first direction and are disposed at predetermined gaps from the first connection terminals, a plurality of connection wiring lines that are disposed on the second surface, each having first portions that substantially overlap the first and second connection terminals in plan view and are formed smaller than the first and second connection terminals in plan view, and a second portion that is formed to have a width narrower than the first portion in the first direction, and a plurality of through holes that pass through the first substrate so as to correspondingly connect the second connection terminals to the connection wiring lines.

According to such a configuration, the first and second connection terminals are provided along the second direction, not in a zigzag shape, and the connection wiring line is provided to overlap the first and second connection terminals. Further, the second connection terminals are electrically connected to the connection wiring lines. Therefore, a conductive pattern electrically connected to the first connection terminals can be provided on the first surface and a conductive pattern electrically connected to the second connection terminals can be provided on the second surface. That is, the conductive patterns can be provided on separate surfaces. Therefore, more connection terminals can be provided in the same area, as compared with the case in which the connection terminals are provided in the zigzag shape. Specifically, in a case in which a same number of connection terminals are provided, it is possible to reduce the mounting substrate. Further, the first and second connection terminals are formed larger than the first portions of the connection wiring line, and thus, when the second substrate having the third connection terminals and the mounting substrate according to the fifth aspect of the invention are mounted, for example, it is possible to reduce the connection defects between the first and second connection terminals of the mounting substrate and the third connection terminals of the second substrate caused by the positional deviation of both substrates. Further, on the mounting substrate, the connection wiring line overlaps the first connection terminal and the second connection terminal in plan view, and at least a portion of the connection wiring line has a narrow portion formed by the first portions and the second portion. Therefore, when the mounting substrate according to the fifth aspect of the invention and the second substrate having the third connection terminals are connected to each other, after the connection, the inspection for a positional deviation of both substrates, that is, the inspection for connection defects of the first and second connection terminals and the third connection terminal, can be easily performed. For example, it is assumed that the first substrate and the second substrate have higher light transmittance than those of the first connection terminal, the second connection terminal, the third connection terminal, and the connection wiring line. More specifically, it is assumed that the first substrate and the second substrate have light transmissive properties, while the first connection terminal, the second connection terminal, the third connection terminal, and the connection wiring line have light-shielding properties. In this case, the inspection for a positional deviation can be performed by irradiating light onto the mounting structure from one side thereof and by observing transmitted light from the other side thereof. If doing so, it can be observed that light passes through in a region where only the first substrate exists, a region where only the second substrate exists, or a region where only the first substrate and the second substrate overlap. On the other hand, it can be observed that light is shielded in a region where at least one of the first, second and third connection terminals and the connection wiring line exists. Then, the pattern shape of the light shielding region can be visually recognized through brightness of the light transmission region and the light shielding region. Then, only in a case in which the pattern shape of the light shielding region has a narrow portion having a narrow width (which corresponds to a narrow portion of the connection wiring line) and a plurality of patterns disposed in the first direction are separated from each other to have independent shapes, without contacting each other, it can be judged that there are no connection defects. In such a manner, the positional deviation and the connection defects can be easily judged by visually recognizing the pattern shape of the light shielding region, specifically, by visually recognizing how the shape in the vicinity of a narrow portion formed by the first portions and the second portion of the connection wiring line is observed. Further, in a case in which a light transmissive property is bad since the second substrate is of a four-layered substrate structure or the like, the inspection for a positional deviation can be performed by reflection. Specifically, when light is irradiated onto the mounting structure from a first substrate side, it is possible to judge whether or not the connection defects exist through the pattern shape of reflected light by the connection wiring line, the first, second, and third connection terminals. Further, in a case of the inspection by use of reflected light, the first substrate and an adhesive, such as the ACF connecting the first substrate and the second substrate, must have the light transmissive properties. At this time, even when the second substrate does not have the light transmissive property, the inspection can be performed unlimitedly.

According to a sixth aspect of the invention, a mounting substrate includes a first substrate that has a first surface and a second surface, a plurality of first connection terminals that are disposed on the first surface in a first direction, a plurality of second connection terminals that are disposed on the first surface in a second direction perpendicular to the first direction and are disposed at predetermined gaps from the first connection terminals, a plurality of connection wiring lines that are disposed on the second surface, each having first portions that substantially overlap the first and second connection terminals in plan view and are formed larger than the first and second connection terminals in plan view, and a second portion that is formed to have a width narrower than those of the first and second connection terminals in the first direction, and a plurality of through holes that passes through the first substrate so as to correspondingly connect the second connection terminals to the connection wiring lines.

According to such a configuration, the first and second connection terminals are provided in the second direction, not in a zigzag shape, and the connection wiring line is provided to overlap the first and second connection terminals. Further, the second connection terminals are electrically connected to the connection wiring lines. Therefore, a conductive pattern electrically connected to the first connection terminals can be provided on the first surface and a conductive pattern electrically connected to the second connection terminals can be provided on the second surface. That is, the conductive patterns can be provided on separate surfaces. Therefore, more connection terminals can be provided in the same area, as compared with the case in which the connection terminals are provided in the zigzag shape. Specifically, in a case in which a same number of connection terminals are provided, it is possible to reduce the mounting substrate. Further, on the mounting substrate, the connection wiring line overlaps the first and second connection terminals in plan view, and at least a portion of the connection wiring line has a narrow portion formed by the first portions and the second portion. Therefore, when the mounting substrate according to the sixth aspect of the invention and the second substrate having the third connection terminals are connected to each other, after the connection, the inspection for a positional deviation of both substrates, that is, the inspection for connection defects of the first and second connection terminals and the third connection terminal, can be easily performed. For example, it is assumed that the first substrate and the second substrate have higher transmittance than the first connection terminal, the second connection terminal, the third connection terminal and the connection wiring line. More specifically, it is assumed that the first substrate and the second substrate have light transmissive properties, while the first connection terminal, the second connection terminal, the third connection terminal, and the connection wiring line have light shielding properties. In this case, the inspection for a positional deviation can be performed by irradiating light from one side thereof and observing transmitted light from the other side thereof. If doing so, it can be observed that light passes through in a region where only the first substrate exists, a region where only the second substrate exists, or a region where only the first substrate and the second substrate overlap. On the other hand, it can be observed that light is shielded in a region where at least one of the first, second and third connection terminals and the connection wiring line exists. Then, the pattern shape of the light shielding region can be visually recognized through brightness of the light transmission region and the light shielding region. Then, only in a case in which the pattern shape of the light shielding region has a narrow portion having a narrow width (which corresponds to a narrow portion of the connection wiring line) and a plurality of patterns disposed in the first direction are separated from each other to have independent shapes, without contacting each other, it can be judged that there are no connection defects. In such a manner, the positional deviation and the connection defects can be easily judged by visually recognizing the pattern shape of the light shielding region, specifically, by visually recognizing how the shape in the vicinity of a narrow portion formed by the first portions and the second portion of the connection wiring line is observed. Further, in a case in which a light transmissive property is bad since the second substrate is of a four-layered substrate structure or the like, the inspection for a positional deviation can be performed by reflection. Specifically, light may be irradiated onto the mounting structure from a first substrate side, and a difference in intensity (color difference) of reflected light by the connection wiring line and reflected light by the third connection terminal may be observed. That is, when the first substrate and the second substrate are connected to each other with no positional deviation, the first portions of the connection wiring line completely overlap the third connection terminal in plan view, such that only reflected light by the connection wiring line is observed, that is, reflected light having a kind of light intensity is observed. On the other hand, in a case in which the first substrate and the second substrate are connected to each other with the positional deviation, both of reflected light by the connection wiring line and reflected light by the third connection terminal are observed, that is, reflected light of two kinds of light intensity is observed. In such a manner, the inspection for a positional deviation can be performed by use of reflected light, and thus it is possible to judge whether or not the connection defects exist through the pattern shape of reflected light to be observed. Here, the first portions of the connection wiring line are formed larger than the first and second connection terminals in plan view, and thus, when observing the first substrate in plan view, the first and second connection terminals completely overlap the connection wiring line and cannot be observed by the connection wiring line. Therefore, at the time of the inspection for a positional deviation by use of reflected light, two kinds of reflected light by the connection wiring line and reflected light by the third connection terminal are simply observed, and thus the inspection can be easily performed, as compared to the case in which three or more kinds of reflected light are observed. Further, in a case of the inspection by use of reflected light, the first substrate and an adhesive, such as the ACF connecting the first substrate and the second substrate, must have the light transmissive properties. At this time, even when the second substrate does not have the light transmissive property, the inspection can be performed unlimitedly.

According to a seventh aspect of the invention, an electro-optical device includes an electro-optical material, a substrate for an electro-optical device that holds the electro-optical material, a first substrate that has a first surface and a second surface and is electrically connected to the substrate for an electro-optical device, a plurality of first connection terminals that are disposed on the first surface in a first direction, and a plurality of second connection terminals that are disposed on the first surface in a second direction perpendicular to the first direction and are disposed at predetermined gaps from the first connection terminals, a plurality of connection wiring lines that are disposed on the second surface, each having first portions that overlap the first and second connection terminals in plan view and a second portion that is formed to have a width narrower than those in the first and second connection terminals in the first direction, a plurality of through holes that pass through the first substrate so as to correspondingly connect the second connection terminals to the connection wiring lines, and a second substrate that has a plurality of third connection terminals being connected to the first and second connection terminals and correspondingly overlap the first and second connection terminals in plan view.

According to such a configuration, the first and second connection terminals are provided in the second direction, not in a zigzag shape, and the connection wiring line is provided to overlap the first and second connection terminals. Further, the second connection terminals are electrically connected to the connection wiring lines. Therefore, a conductive pattern electrically connected to the first connection terminals can be provided on the first surface and a conductive pattern electrically connected to the second connection terminals can be provided on the second surface. That is, the conductive patterns can be provided on separate surfaces. Therefore, more connection terminals can be provided in the same area, as compared with the case in which the connection terminals are provided in the zigzag shape. Specifically, in a case in which a same number of connection terminals are provided, it is possible to reduce the connection area of the first substrate and the second substrate. Further, on the first substrate, the connection wiring line overlaps the first and second connection terminals in plan view, and at least a portion (the second portion) of the connection wiring line has a width narrower than that of each of the first and second connection terminals. Therefore, after the first substrate and the second substrate are connected to each other, the inspection for a positional deviation of both substrates, that is, the inspection for connection defects of the first and second connection terminals and the third connection terminal, can be easily performed. For example, it is assumed that the first substrate and the second substrate have higher transmittance than the first connection terminal, the second connection terminal, the third connection terminal and the connection wiring line. More specifically, it is assumed that the first substrate and the second substrate have light transmissive properties, while the first connection terminal, the second connection terminal, the third connection terminal, and the connection wiring line have light-shielding properties. In this case, the inspection for a positional deviation can be performed by irradiating light onto the mounting structure from one side thereof and observing transmitted light from the other side thereof. If doing so, it can be observed that light passes through in a region where only the first substrate exists, a region where only the second substrate exists, or a region where only the first substrate and the second substrate overlap. On the other hand, it can be observed that light is shielded in a region where at least one of the first, second and third connection terminals and the connection wiring line exists. Then, the pattern shape of the light shielding region can be visually recognized through brightness of the light transmission region and the light shielding region. Then, only in a case in which the pattern shape of the light shielding region has a narrow portion and a plurality of patterns disposed in the first direction are separated from each other to have independent shapes, without contacting each other, it can be judged that there are no connection defects. In such a manner, the positional deviation and the connection defects can be easily judged by visually recognizing the pattern shape of the light shielding region. Therefore, manufacturing efficiency of the electro-optical device can be enhanced and an electro-optical device having superior display characteristics with no connection defects can be easily obtained. Further, in a case in which a light transmissive property is bad since the second substrate is of a four-layered substrate structure or the like, the inspection for a positional deviation can be performed by reflection. Specifically, light may be irradiated onto the mounting structure from a first substrate side, and a difference in intensity (color difference) of reflected light by the connection wiring line and reflected light by the third connection terminal may be observed. That is, when the first substrate and the second substrate are connected to each other with no positional deviation, the first portions of the connection wiring line completely overlap the third connection terminal in plan view, such that only reflected light by the connection wiring line is observed, that is, reflected light having a kind of light-intensity is observed. On the other hand, in a case in which the first substrate and the second substrate are connected to each other with the positional deviation, both of reflected light by the connection wiring line and reflected light by the third connection terminal are observed, that is, reflected light of two kinds of light intensity is observed. In such a manner, the inspection for a positional deviation can be performed by use of reflected light, and thus it is possible to judge whether or not the connection defects exist through the pattern shape of reflected light to be observed. Further, in a case of the inspection by use of reflected light, the first substrate and an adhesive, such as the ACF connecting the first substrate and the second substrate, must have the light transmissive properties. At this time, even when the second substrate does not have the light transmissive property, the inspection can be performed unlimitedly.

According to an eighth aspect of the invention, an electronic apparatus includes the electro-optical device described above.

According to such a configuration, an electronic apparatus having a display screen with superior display characteristics with no connection defects between two substrates can be obtained.

BRIEF DESCRIPTION OF THE DRAWINGS

The invention will be described with reference to the accompanying drawings, wherein like numbers reference like elements, and wherein.

DESCRIPTION OF THE EMBODIMENTS

Figure 1:
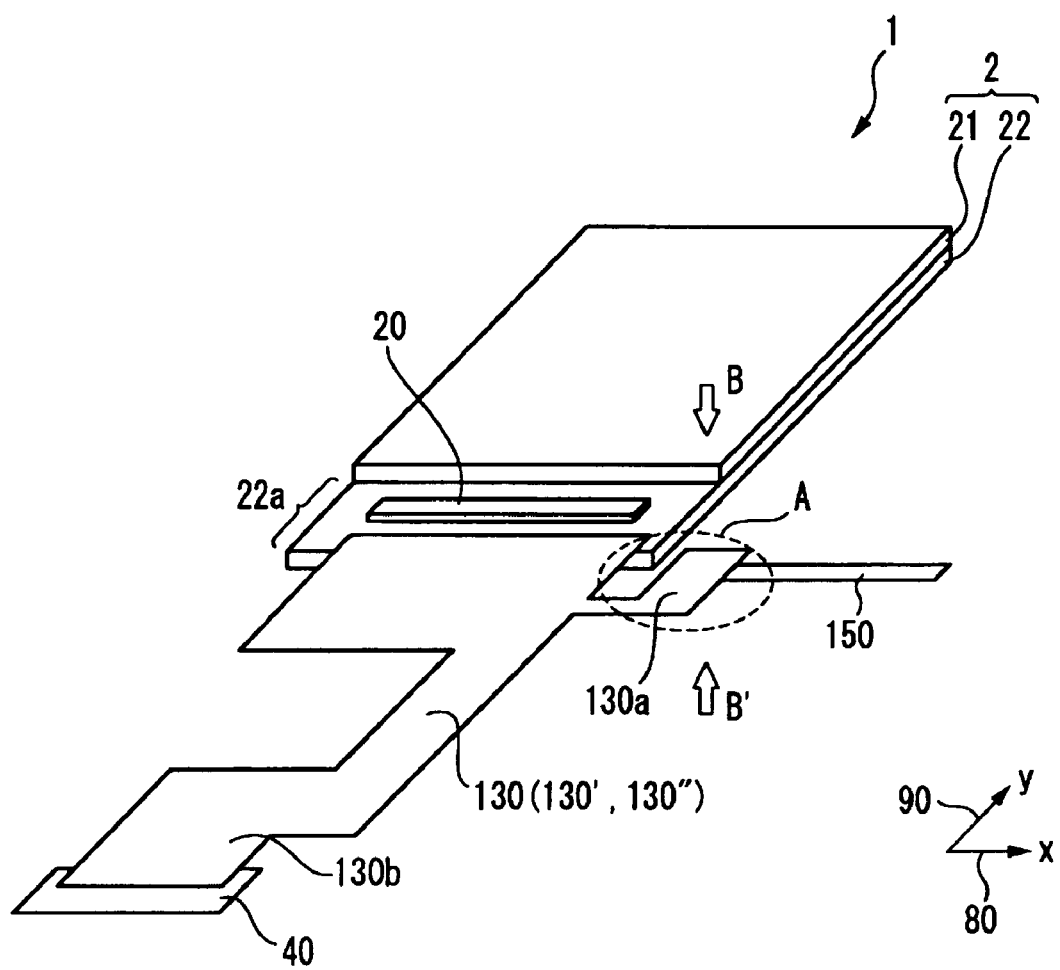
FIG. 1 is a schematic perspective view of a liquid crystal device according to an embodiment.

Hereinafter, embodiments of the invention will be described with reference to the drawings. Moreover, in the embodiment described below, a liquid crystal device will be used as an electro-optical device. Specifically, a simple matrix-type liquid crystal device of a COG method is described, but an active matrix-type liquid crystal device of a TFT method or TFD method may be used. Further, in the drawings, the scale of each part or the number of parts has been adjusted in order to have a recognizable size.

<Configuration of Mounting Structure and Electro-Optical Device>

Figure 2:
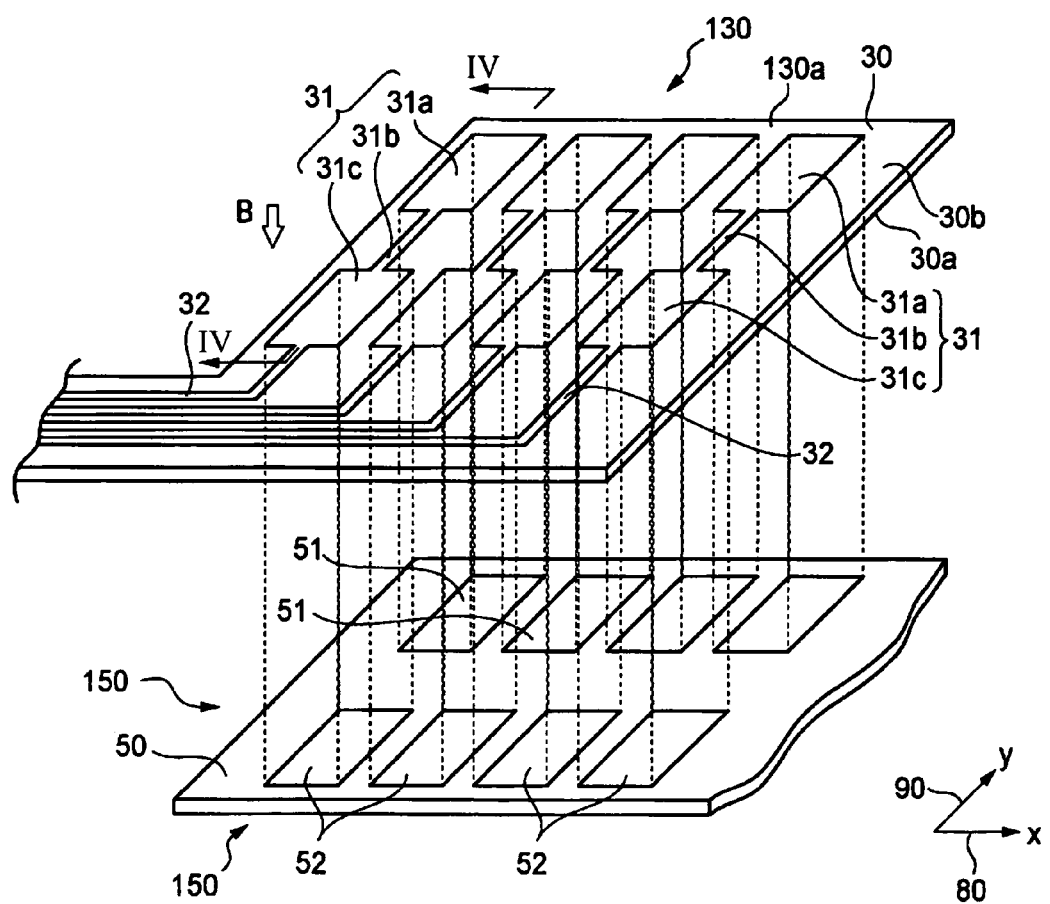
FIG. 2 is an exploded perspective view showing a region which is encircled by an ellipse A of FIG. 1 in a magnified scale.
Figure 3A:
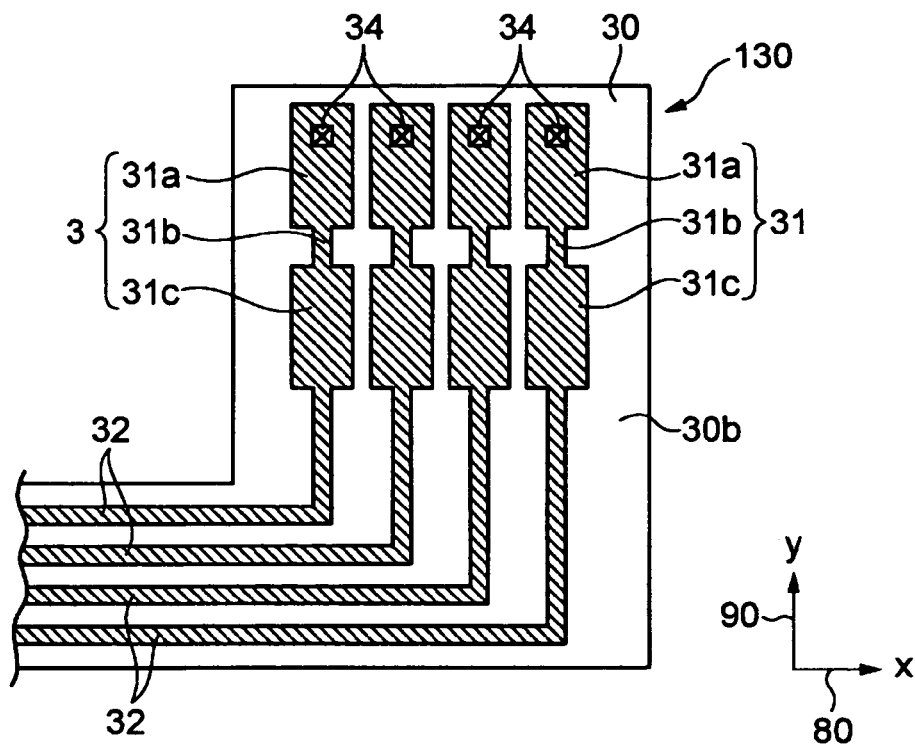
FIG. 3A is a partially schematic plan view showing the positional relationship between connection terminals of a flexible wiring board and wiring lines.
Figure 3B:
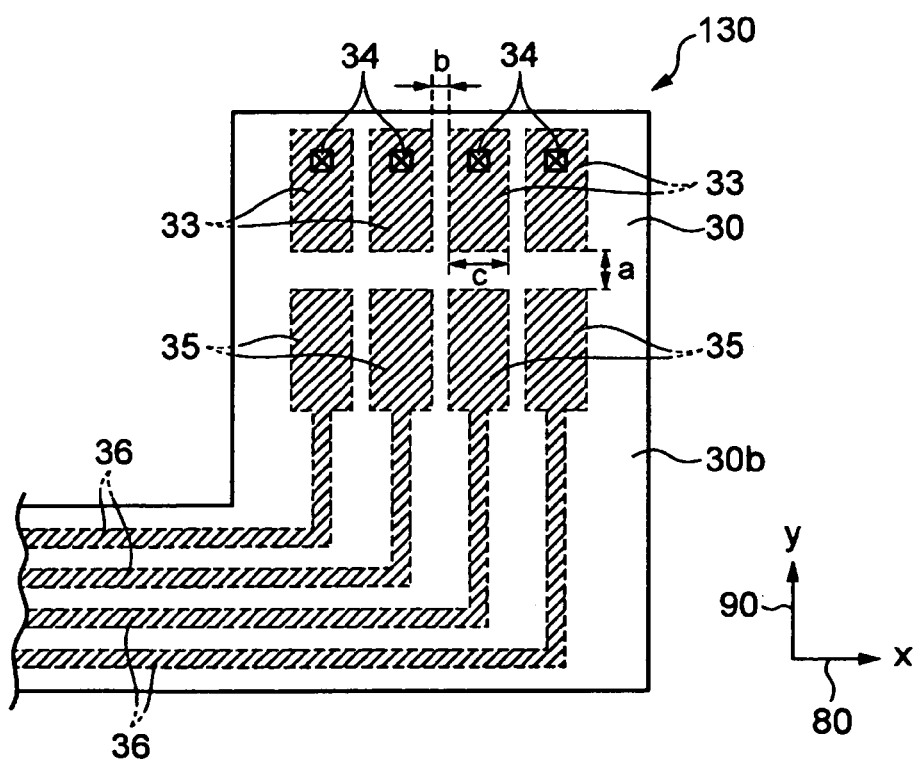
FIG. 3B is a partially schematic plan view showing the positional relationship between connection terminals of a flexible wiring board and wiring lines.
Figure 4:
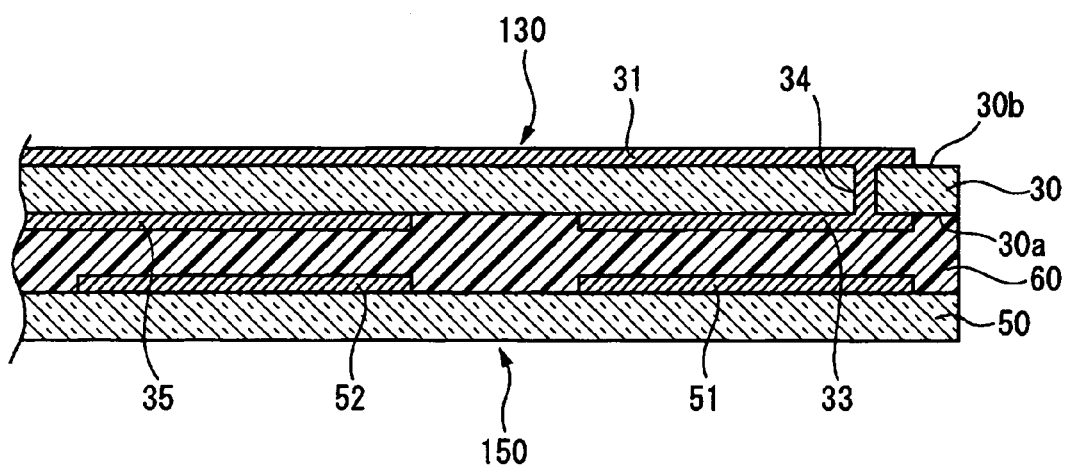
FIG. 4 is a cross-sectional view of a flexible wiring board and a rigid substrate taken along the line IV-IV of FIG. 2.

FIG. 1 is a schematic perspective view of a liquid crystal device, which is an example of an electro-optical device having a mounting structure according to an embodiment of the invention. FIG. 2 is an exploded perspective view of a region which is encircled by an ellipse A of FIG. 1 in a magnified scale. Further, in FIG. 2, an ACF (Anisotropic Conductive Film) serving as a conductive member which electrically connects a flexible wiring board to a rigid substrate is omitted. FIGS. 3A and 3B are partially expanded plan views of the flexible wiring board in the region encircled by the ellipse A of FIG. 1. FIGS. 3A and 3B are plan views of the flexible wiring board as viewed in an arrow B direction. FIG. 3A shows connection wiring lines provided on a surface (a second surface 30b to be described below) which can be visually recognized as viewed in the arrow B direction, and FIG. 3B shows connection terminals provided on a surface (a first surface 30a to be described below) which can be visually recognized as viewed in an arrow B' direction in perspective view. FIG. 4 is a schematic cross-sectional view of the flexible wiring board and the rigid substrate taken along the line IV-IV of FIG. 2.

As shown in FIG. 1, a liquid crystal device 1 includes a liquid crystal panel 2 serving as an electro-optical panel, a pair of polarizers (not shown) with the liquid crystal panel 2 interposed therebetween, a flexible wiring board 130 electrically connected to the liquid crystal panel 2, a driving IC 20 mounted on the liquid crystal panel 2, a circuit board 40 electrically connected to the flexible wiring board 130, which serves as a mounting substrate, and a rigid substrate 150, which serves as a second substrate, electrically connected to the flexible wiring board 130. The liquid crystal device 1 has the connection structure of the flexible wiring board 130 and the rigid substrate 150 as a mounting structure.

The liquid crystal panel 2 includes a first substrate 21 for a liquid crystal device having a pair of insulating substrates, such as glass or the like, which are bonded by a sealant (not shown), and a second substrate 22 for a liquid crystal device which serves as a substrate for an electro-optical device. Within a region surrounded by the sealant between the first substrate 21 for a liquid crystal device and the second substrate 22 for a liquid crystal device, for instance, 90° twisted STN (Super Twisted Nematic) liquid crystal (not shown) is held as an electro-optical material.

In the first substrate 21 for a liquid crystal device, common electrodes (not shown) which are in a plurality of stripe shapes and which are made of a transparent ITO (Indium Tin Oxide) film, and an alignment film (not shown) to cover the common electrodes are provided.

On the other hand, in the second substrate 22 for a liquid crystal device, segment electrodes (not shown) which are in a plurality of stripe shapes and which are made of a transparent ITO film to cross the common electrodes in plan view, and an alignment film (not shown) to cover the segment electrodes are provided.

The second substrate 22 for a liquid crystal device has an extension portion 22a which extends more than the first substrate 21 for a liquid crystal device. The driving IC 20 as a semiconductor element is disposed in the extension portion 22a. In the extension portion 22a, wiring lines (not shown) to electrically connect the common electrodes with the driving IC 20, wiring line (not shown) to electrically connect the segment electrodes to the driving IC 20, and wiring lines (not shown) to electrically connect the driving IC 20 to the flexible wiring board 130 are provided. When the liquid crystal device 1 is assembled into an electronic apparatus or the like, the flexible wiring board 130 is bent, such that most of the flexible wiring board 130 is disposed to be adjacent to the second substrate 22 for a liquid crystal device of the liquid crystal display panel 2.

As shown in FIG. 1, the flexible wiring board 130 has one end that is electrically connected to the liquid crystal panel 2, another end 130b that is electrically connected to the circuit board 40, and still another end 130a that is electrically connected to the rigid substrate 150. A voltage boosting circuit is provided in the rigid substrate 150. A power supply circuit is provided in the circuit board 40.

As shown in FIG. 4, the flexible wiring board 130 includes a first base substrate 30 that serves as a first substrate and has a first surface 30a and a second surface 30b, which face each other and which are made of polyimide having a light transmissive property, first connection terminals 35 and second connection terminals 33 that are provided on the first surface 30a, and a plurality of connection wiring lines 31 that are provided on the second surface 30b. In the first base substrate 30, through holes 34 that pass through the first base substrate 30 are provided, and the second connection terminals 33 and the connection wiring lines 31 are electrically connected to each other through conductive layers provided in the through holes 34. The first connection terminals 35, the second connection terminals 33, the connection wiring lines 31, and the through holes 34 are made of copper (Cu). The first surface 30a of the first base substrate 30 is a mounting surface which is mounted on the rigid substrate 150, and the second surface 30b is a non-mounting surface. As shown in FIG. 3B, on the first surface 30a, a plurality of first connection terminals 35 (in the present embodiment, four) that are disposed in an x axis direction 80 as a first direction, a plurality of second connection terminals 33 (in the present embodiment, four) that are disposed on the first surface 30a at predetermined gaps from the first connection terminals 35 in a y axis direction 90 as a second direction perpendicular to the x axis direction 80, and wiring lines 36 that are connected to the first connection terminals 35 are provided. On the second surface 30b, a plurality of connection wiring lines 31 that overlap the first connection terminals 35 and the second connection terminals 33 in plan view, and wiring lines 32 that are connected to the connection wiring lines 31 are provided. Each of the connection wiring line 31 is provided to extend the y axis direction 90, and the width (the width in the x axis direction 80) partially narrows. Specifically, the connection wiring line 31 has a first wide portion 31a as a first portion, a second wide portion 31c, and a narrow portion 31b as a second portion. The first wide portion 31a overlaps the second connection terminal 33 in plan view, and the second wide portion 31c overlaps the first connection terminal 35 in plan view. The narrow portion 31b is provided to have a width narrower than the width of each of the first and second connection terminals 35 and 33 in the x axis direction 80. As described above, the connection wiring lines 31 are electrically connected to the second connection terminals 33 through the through holes 34. Therefore, of power supplied from the rigid substrate 150, power, which is supplied to the first connection terminals 35, is supplied to the wiring lines 36 provided on the first surface 30a, and power, which is supplied to the second connection terminals 33, is supplied to the wiring lines 32 provided on the second surface 30b. In the present embodiment, a distance a between the first connection terminal 35 and the second connection terminal 33 is 400 μm, a distance b between adjacent connection terminals is 200 μm, and a connection terminal width c is 300 μm, but a more narrow pitch is possible.

As such, the first connection terminals 35 and the second connection terminals 33 are provided in one direction (in the present embodiment, the y axis direction 90), not in a zigzag shape, and the wiring lines, to which the respective connection terminals are connected, are provided on a surface facing the first base substrate 30. Therefore, more connection terminals can be provided in the same area, as compared with the case in which the connection terminals are provided in the zigzag shape. As a result, the connection area of the flexible wiring board and the rigid substrate can be reduced.

As shown in FIGS. 2 and 4, the rigid substrate 150 includes a second base substrate 50 that is made of glass-cloth-epoxy resin with a light transmissive property, third connection terminals 52 that are electrically connected to the first connection terminals 35 through the ACF 60, and third connection terminals 51 that are electrically connected to the second connection terminal 33 through the ACF 60. The ACF 60 is obtained by dispersing conductive particles in resin with a light transmissive property. The third connection terminals 51 and 52 are provided on one surface of the second base substrate 50. On the other surface of the second base substrate 50, wiring lines (not shown) that are electrically connected to a power control circuit, a voltage boosting circuit, and a DC/DC converter are provided. The wiring lines and the third connection terminals 51 and 52 are electrically connected via through holes (not shown) provided in the second base substrate 50. The third connection terminals 51 and 52 are made of copper (Cu). When the flexible wring line substrate 130 and the rigid substrate 150 are connected to each other with no positional deviation, the third connection terminals 51 overlap the second connection terminals 33 in plan view, and the third connection terminals 52 overlap the first connection terminals 35 in plan view.

In the present embodiment, the first base substrate 30 and the second base substrate 50 have higher light transmittance than those of the first connection terminals 35, the second connection terminals 33, the third connection terminals 51 and 52, and the connection wiring lines 31.

In the present embodiment, in the flexible wiring board 130, the connection wiring lines 31 overlap the first connection terminals 35 and the second connection terminals 33 in plan view, and at least a portion of each of the connection wiring lines 31 has a width narrower than those of the first connection terminals 35 and the second connection terminals 33. Therefore, after the flexible wiring board 130 and the rigid substrate 150 are connected to each other by the ACF 60, the inspection of a positional deviation of both substrates can be easily performed. Hereinafter, an inspection method of a positional deviation will be described in detail.

In the inspection for the positional deviation, the first base substrate 30, the second base substrate 50, and the ACF 60 having a light transmissive property, and the connection wiring lines 31, the first connection terminals 35, the second connection terminals 33, and the third connection terminals 51 and 52 having a light shielding property are used. Specifically, for the flexible wiring board 130 and the rigid substrate 150 that overlap each other, the inspection for a positional deviation is performed by observing the flexible wiring board 130 and the rigid substrate 150 in the arrow B' direction shown in FIG. 1 in a state in which light is irradiated from a rigid substrate 150 side, that is, light is irradiated in the arrow B' direction shown in FIG. 1. The inspection for a positional deviation is performed by irradiating light and then observing the transmission. In this case, it is observed that light passes through in a region where only the first base substrate 30 exists, a region where only the second base substrate 50 exists, or a region where only the first base substrate 30 and the second base substrate 50 overlap each other. On the other hand, it is observed that light is shielded in a region where at least one of the connection wiring line 31, the first connection terminal 35, the second connection terminal 33, and the third connection terminals 51 and 52 exists. Therefore, the pattern shape of the light shielding region can be visually recognized by brightness between the light transmission region and the light shielding region. Then, according to the pattern shape of the light shielding region, it can be judged whether or not the positional deviation exists or whether or not the connection is defective.

Next, the judgment method of whether or not the positional deviation exists will be described with reference to FIGS. 5A to 5C by way of the pattern shape of the light shielding region.

Figure 5A:
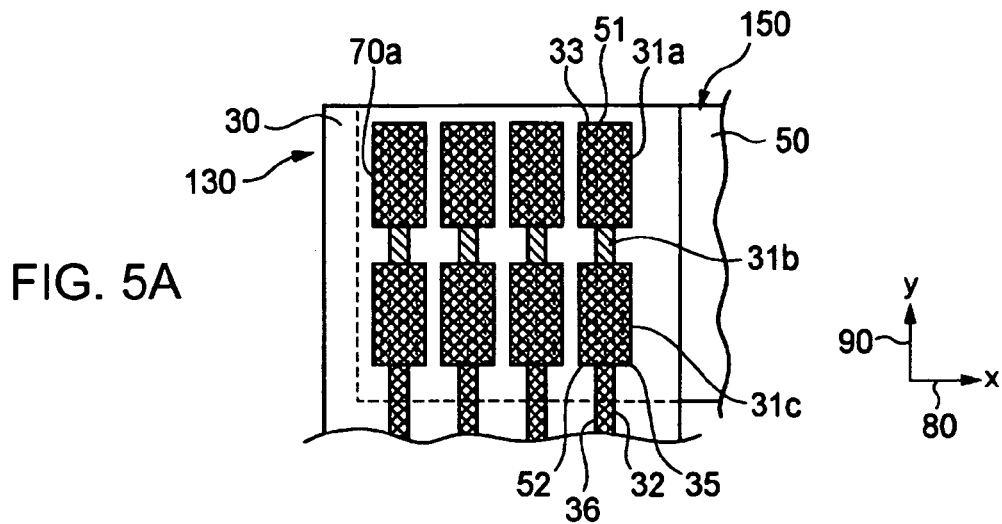
FIG. 5A is a plan view showing an inspection method of a positional deviation of the flexible wiring board and the rigid substrate.
Figure 5B:
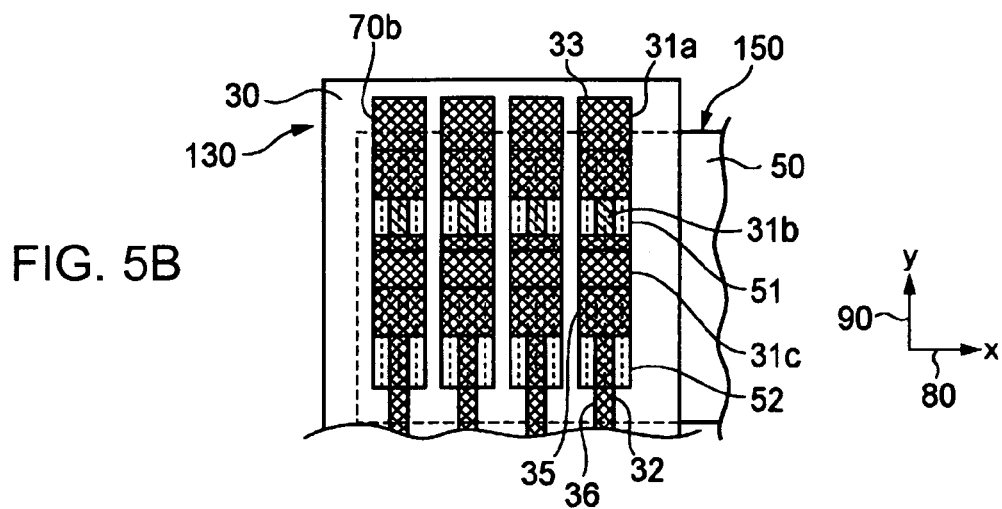
FIG. 5B is a plan view showing an inspection method of a positional deviation of the flexible wiring board and the rigid substrate.
Figure 5C:
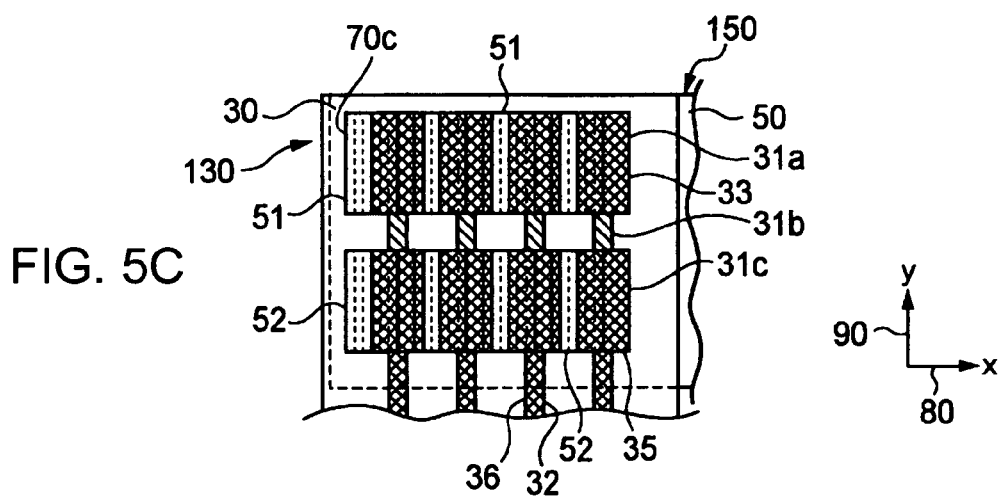
FIG. 5C is a plan view showing an inspection method of a positional deviation of the flexible wiring board and the rigid substrate.

FIGS. 5A to 5C correspond to a partially expanded view of the region encircled by the ellipse A of FIG. 1. FIGS. 5A to 5C are plan views when light is irradiated onto the flexible wiring board 130 and the rigid substrate 150 in the arrow B' direction shown in FIG. 1 and the flexible wiring board 130 and the rigid substrate 150 are observed in the arrow B' direction shown in FIG. 1. FIG. 5A is a plan view showing a state in which the flexible wiring board 130 and the rigid substrate 150 are connected with no positional deviation. FIGS. 5B and 5C are plan views showing an example in which the positional deviation exists. In FIG. 5, downward hatched regions represent the connection wiring lines 31 provided on the second surface 30b and the wiring lines 32 connected thereto. Further, upward hatched region represent the first connection terminals 35 and the second connection terminals 33 provided on the first face 30a and the wiring lines 36 connected to the first connection terminals 35. Further, vertical-dotted-line hatched regions having solid-line outlines represent the third connection terminals 51 and 52 provided on the rigid substrate 150.

As shown in FIG. 5A, in a case in which the flexible wiring board 130 and the rigid substrate 150 are connected to each other with no positional deviation, a region where at least one of the connection wiring line 31, the first connection terminal 35, the second connection terminal 33, and the third connection terminals 51 and 52 is exists, that is, the pattern shape of the light shielding region 70a, is observed in the same shape as the planar shape of the connection wiring line 31. As such, in a case in which the pattern shape of the light shielding region 70a has a narrow portion, and a plurality of patterns disposed in the x axis direction 80 in the drawing are separated from one another in independent shapes, without contacting one another, it can be judged that the positional deviation does not exist and that there are no connection defects between the flexible wiring board 130 and the rigid substrate 150.

On the contrary, in a case in which the light shielding regions 70b and 70c are observed, as shown in FIGS. 5B and 5C, it can be judged that the positional deviation exist and the connection defects are generated.

FIG. 5B shows an example in which the positional deviation exists in the y axis direction 90 in the drawing, and in which the third connection terminals 51 overlap the first connection terminals 35 as well as the second connection terminals 33 in plan view. In this case, although the third connection terminals 51 originally have to be only electrically connected to the second connection terminals 33, the third connection terminals 51 are electrically connected to the first connection terminals 35, such that the connection defects occur. In this case, the pattern shape of the light shielding region 70b is such that the plurality of patterns disposed in the x axis direction 80 in the drawing are separated from each other, without contacting each other. However, there is no narrow portion 31b having a narrow width. As such, in a case in which there is no narrow portion in the pattern shape of the light shielding region 70b, it can be judged that the positional deviation exists and the connection defects are generated.

FIG. 5C shows an example in which the positional deviation occurs in the x axis direction 80 in the drawing, and in which the third connection terminal 51 overlaps the two second connection terminals 33 as well as the one second connection terminal 33 in plan view and third connection terminal 52 overlaps the two first connection terminals 35 as well as the one first connection terminal 35 in plan view. In this case, although the plurality of third connection terminals 51 originally have to be only electrically connected to the second connection terminals 33 or the first connection terminals 35, the plurality of third connection terminals 51 are electrically connected to the two first connection terminals 35 or the two second connection terminals 33, such that the connection defects occur. In this case, the pattern shape of the light shielding region 70c has the narrow portion, but the plurality of patterns disposed in the x axis direction 80 in the drawing are not separated and are linked to one pattern. As such, in a case in which the pattern shape of the light shielding region 70c is not recognized as independent pattern shapes which are separated from each other, it can be judged that the positional deviation exists and the connection defects are generated.

As described above, by observing the pattern shape of the light shielding region by use of light irradiation, when the pattern shape has the narrow portion and the plurality of patterns disposed in the x axis direction 80 in the drawing are separated from each other without contacting each other to be observed as independent forms, that is, when the shape of an angular portion around the narrow portion formed by the wide portions 31a and 31c and the narrow portion 31b of the connection wiring line 31 of the connection wiring line 31 can be observed for each connection wiring line 31, it can be judged that there are no connection defects. Further, the connection defects caused by the positional deviation can be easily judged with visual recognition. As a result, manufacturing efficiency of the liquid crystal device 1 can be enhanced.

Moreover, in the present embodiment, the connection wiring line 31 has the wide portions 31a and 31c and the narrow portion 31b and partially narrows, but all the widths are allowed to be narrower than those of the first connection terminal 35 and the second connection terminal 33. Therefore, the inspection for a positional deviation can be easily performed with the naked eye, as the present embodiment.

Further, transmitted light may be used in the above-described inspection for a positional deviation, but the inspection for a positional deviation can be performed by use of reflected light when the rigid substrate 150 serving as the second substrate has a multi-layered substrate structure and the light transmissive property thereof is bad. In this case, the inspection for a positional deviation is performed by irradiating light from the flexible wiring board 130 side and by observing an intensity difference (color difference) between reflected light by the connection wiring line 31 and reflected light by the third connection terminals 51 and 52. That is, in a case in which the flexible wiring board 130 and the rigid substrate 150 are connected with no positional deviation, the wide portions 31a and 31c serving as the first portion of the connection wiring line 31 completely overlap the third connection terminals 51 and 52 in plan view. Therefore, only reflected light by the connection wiring line 31 is observed, that is, reflected light of one kind of light intensity is observed. On the other hand, in a case in which the positional deviation exists in the flexible wiring board 130 and the rigid substrate 150 to be connected, both reflected light by the connection wiring line 130 and reflected light by the third connection terminals 51 and 52 are observed, that is, reflected light of two kinds of light intensity are observed. Accordingly, in a case in which reflected light of one kind of light intensity is observed, it can be judged that there are no connection defects. On the other hand, in a case in which reflected light of two kinds of light intensity are observed, it can be judged that the positional deviation exists. Further, in the same manner as the observation of the pattern shape of the light shielding region by use of transmitted light, as described above, in a case in which the pattern shape formed by reflected light has the narrow portion and the plurality of patterns disposed in the x axis direction 80 in the drawing are separated from each other without contacting each other to be observed as independent shapes, that is, in a case in which the shape of an angular portion around the narrow portion formed by the wide portions 31a and 31c and the narrow portion 31b of the connection wiring line 31 can be observed for each connection wiring line 31, it can be judged that there are no connection defects. Further, the connection defects due to the positional deviation can be easily judged with the naked eye. Further, in a case of the inspection by use of reflected light, as for the base substrate 50 of the rigid substrate 150, the light transmissive property is not necessarily required.

Figure 6A:
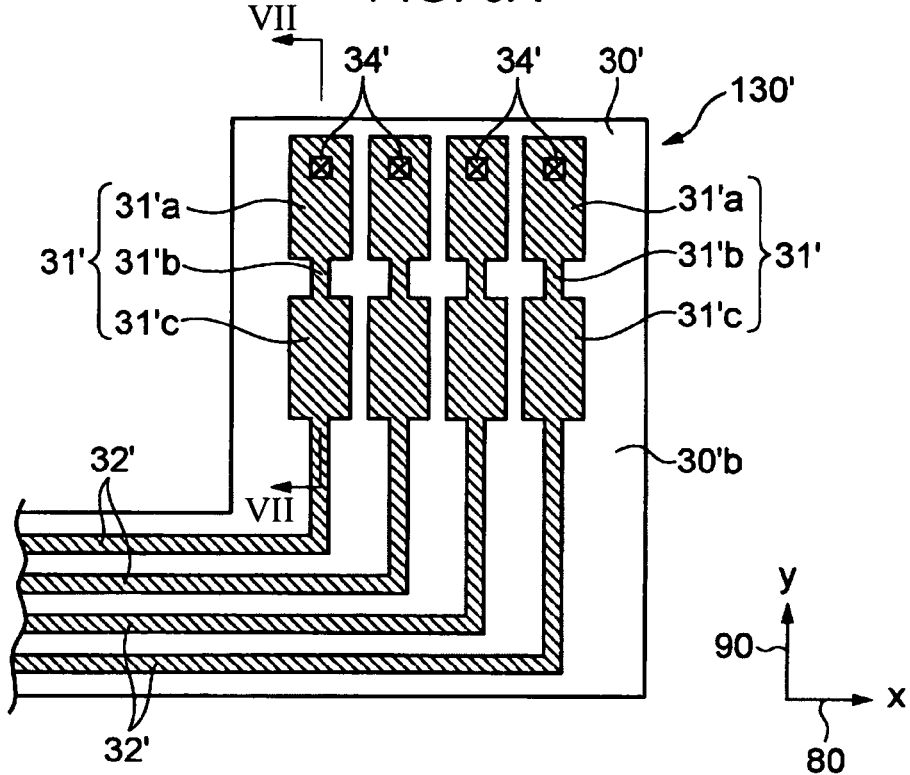
FIG. 6A is a partially schematic plan view of a flexile wiring board in a modification.

In the above-described embodiment, the size of each of the wide portions 31a and 31c of the connection wiring line 31 and the size of each of the first connection terminal 35 and the second connection terminal 33 are the same. On the contrary, as a modification, as shown in FIGS. 6A to 7, the size of each of the first connection terminal 35' and the second connection terminal 33' is allowed to be made larger than the size of each of the wide portions 31a' and 31c' of the connection wiring line 31'. Further, as another modification, as shown in FIGS. 8A to 9, the size of each of the first connection terminal 35" and the second connection terminal 33", is allowed to be made smaller than the size of each of the wide portions 31a" and 31c" of the connection wiring line 31".

Figure 6B:
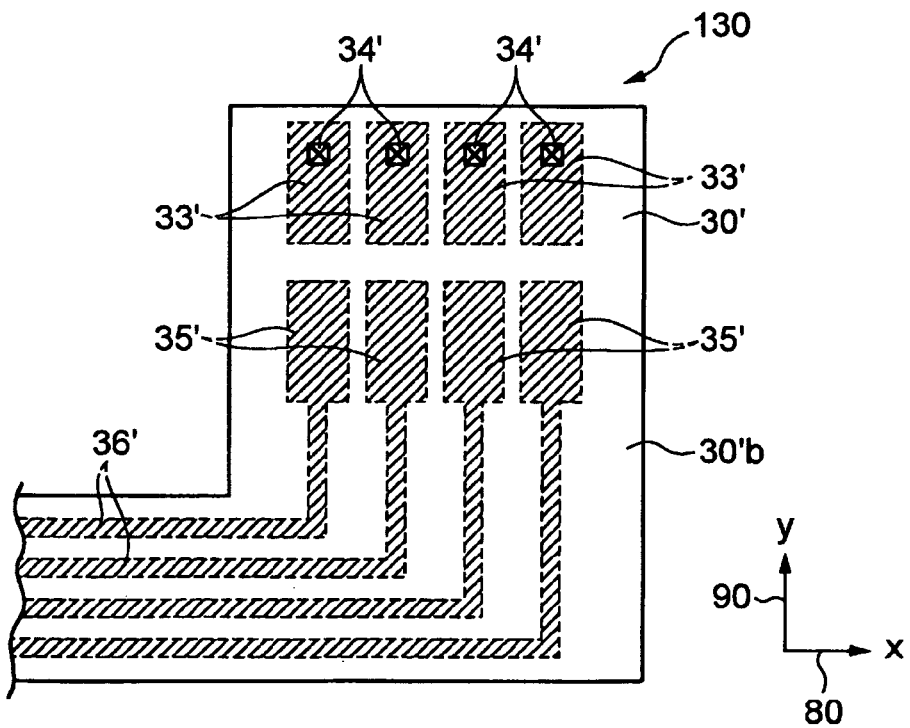
FIG. 6B is a partially schematic plan view of a flexile wiring board in a modification.
Figure 7:
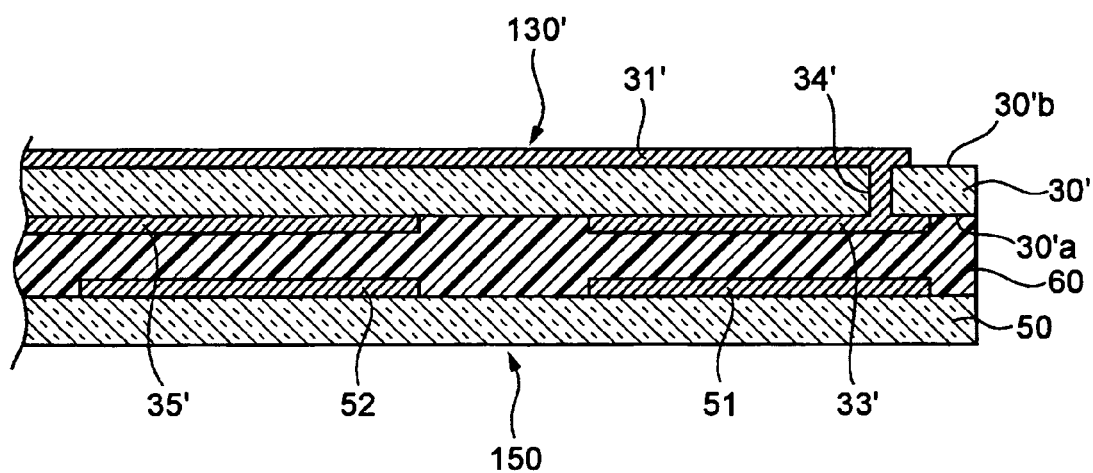
FIG. 7 is a cross-sectional view of a flexible wiring board and a rigid substrate taken along the line VII-VII of FIG. 6A.

FIGS. 6A and 6B are schematic partially expanded plan views of a flexible wiring board 130' in the region encircled by the ellipse A of FIG. 1. FIGS. 6A and 6B are plan views of the flexible wiring board 130' as viewed in the arrow B direction of FIG. 1. FIG. 6A shows connection wiring lines provided on a surface (the second surface (30'b)) which can be recognized with the naked eye as viewed in the arrow B direction, and FIG. 6B shows connection terminals provided on a surface (the first surface (30'a)) which can be recognized with the naked eye as viewed in the arrow B' direction in perspective view. FIG. 7 is a schematic cross-sectional view of the flexible wiring board 130' and the rigid substrate 150 taken along the line VII-VII of FIG. 6A. FIGS. 8A and 8B are schematic partially expanded plan views of the flexible wiring board 130" in the region encircled by the ellipse A of FIG. 1. FIGS. 8A and 8B are plan views of the flexible wiring board 130" as viewed in the arrow B direction of FIG. 1. FIG. 8A shows connection wiring lines provided on a surface (the second surface (30"b)) which can be recognized with the naked eye as viewed in the arrow B direction, and FIG. 8B shows connection terminals provided on a surface (the first surface (30"a)) which can be recognized with the naked eye as viewed in the arrow B" direction in perspective view. FIG. 9 is a schematic cross-sectional view of the flexible wiring board 130", and the rigid substrate 150 taken along the line IX-IX of FIG. 8A.

As shown in FIGS. 6A to 7, the flexible wiring board 130' serving as the mounting substrate in the modification includes a first base substrate 30' that serves as a first substrate, and has a first surface 30'a and a second surface 30'b facing each other, first connection terminals 35' and second connection terminals 33' that are provided on the first surface 30'a, and a plurality of connection wiring lines 31' that are provided on the second surface 30'b. In the first base substrate 30', through holes 34' that pass through the base substrate 30' are provided, and the second connection terminals 33' and the connection wiring lines 31' are electrically connected through the conductive layers provided in the through holes 34'. The first surface 30'a of the first base substrate 30' is a mounting surface which is mounted to the rigid substrate 150, and the second surface 30'b is a non-mounting surface. As shown in FIG. 6B, on the first surface 30'a, a plurality of first connection terminals 35' (in the present embodiment, four) in an x axis direction 80 as a first direction, a plurality of second connection terminals 33' (in the present embodiment, four) that are disposed on the first surface 30'a at predetermined gaps from the first connection terminals 35' in a y axis direction 90 as a second direction perpendicular to the x axis direction 80, and wiring lines 36' that are connected to the first connection terminals 35' are provided. On the second surface 30'b, a plurality of connection wiring lines 31, that overlap the first connection terminals 35' and the second connection terminals 33' in plan view, and wiring lines 32' that are connected to the connection wiring lines 31'. The connection wiring line 31' has a first wide portion 31'a as a first portion, a second wide portion 31'c as a first portion, and a narrow portion 31'b as a second portion. The first wide portion 31'a substantially overlaps the second connection terminal 33' in plan view and has a planar area smaller than that of the second connection terminal 33'. The second wide portion 31'c substantially overlaps the first connection terminal 35' in plan view and has a planar area smaller than that of the first connection terminal 35'. That is, the first connection terminal 35' and the second connection terminal 33' are formed to be larger than the first wide portion 31'a and the second wide portion 31'c of the connection wiring line 31'. The narrow portion 31'b is provided to have a width narrower than those of the first and second wide portions 31'a and 31'b in the x axis direction 80. As such, by forming the first connection terminal 35' and the second connection terminal 33' larger than the first wide portion 31'a and the second wide portion 31'c of the connection wiring line 31', the advantage described below are obtained. That is, when the connection wiring lines are formed on the second surface of the mounting substrate, even if the formation position of the connection wiring line is deviated due to the variation in processing conditions, the shapes of the first wide portion 31'a and the second wide portion 31'c of the connection wiring line can be prevented from being viewed externally. Therefore, even when the shapes of the first connection terminal 35' and the second connection terminal 33' are broken, by aligning the shapes thereof with the shape of the third connection terminal, detection precision of the positional deviation can be prevented from being degraded. Further, in the modification, the first connection terminal 35' and the second connection terminal 33' are formed to be larger than the first wide portion 31'a and the second wide portion 31'c of the connection wiring line 31'. However, it is preferable that the first connection terminal 35' and the second connection terminal 33' are larger by the amount of the positional deviation in the formation position of the connection wiring line. For example, if a tolerance of 0.05 to 0.1 mm is given, detection precision of the positional deviation can be sufficiently maintained.

Figure 8A:
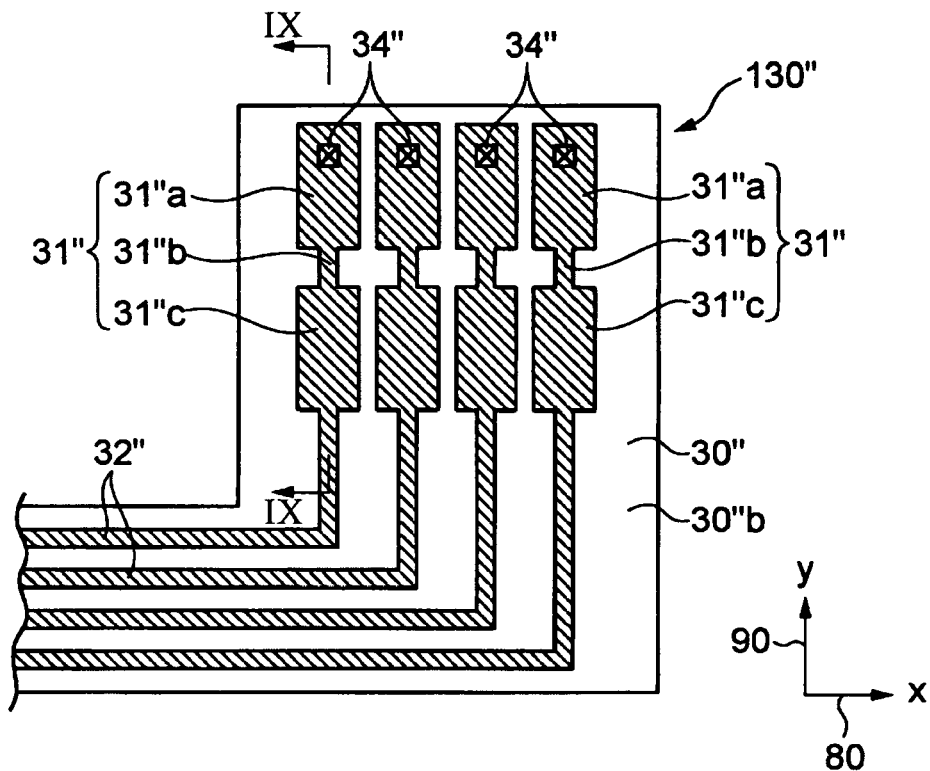
FIG. 8A is a partially schematic plan view of a flexile wiring board in another modification.
Figure 8B:
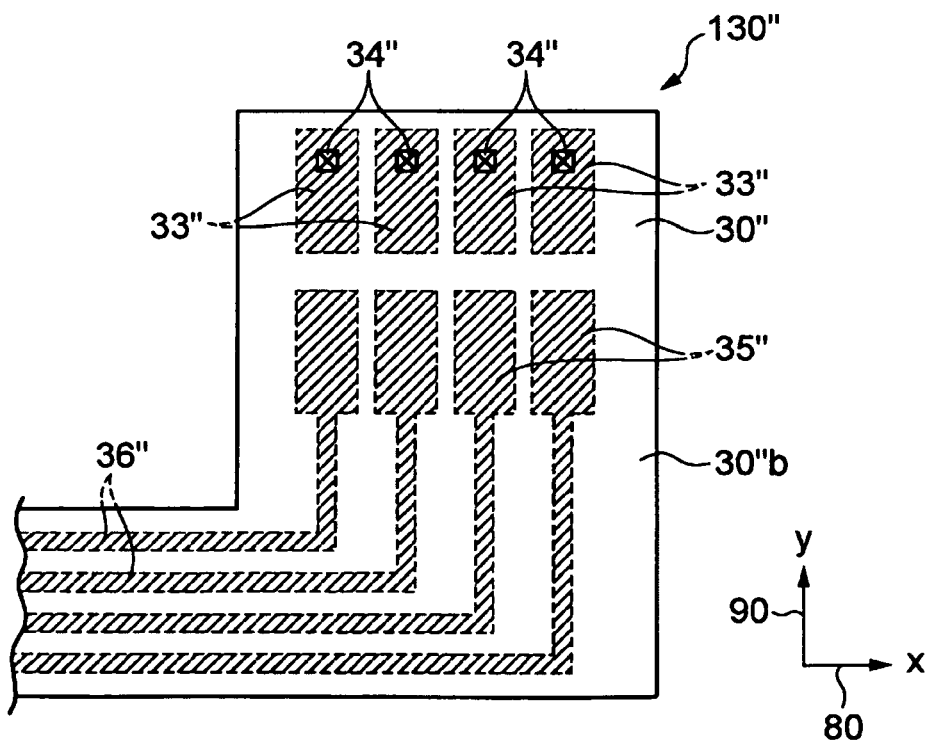
FIG. 8B is a partially schematic plan view of a flexile wiring board in another modification.
Figure 9:
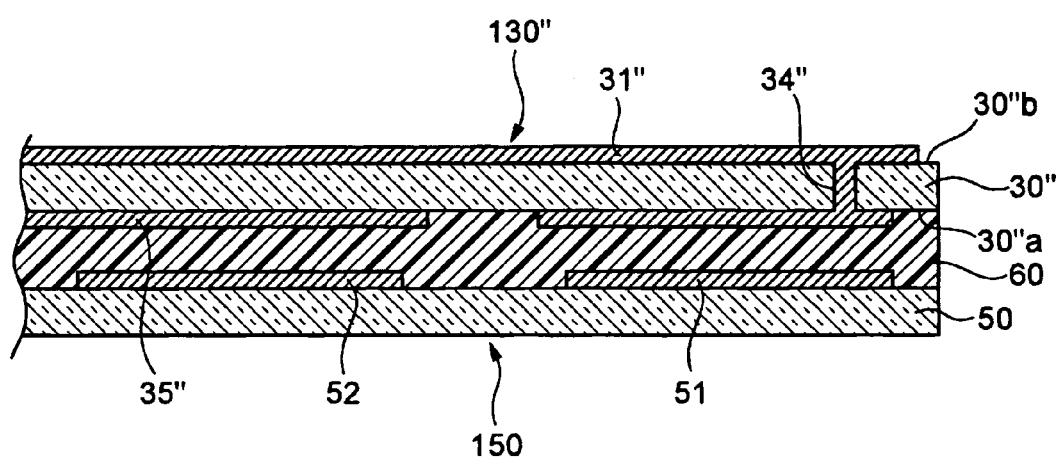
FIG. 9 is a cross-sectional view of the flexible wiring board and the rigid substrate taken along the line IX-IX of FIG. 8A.

As shown in FIGS. 8A to 9, the flexible wiring board 130", serving as the mounting substrate in the modification includes a first base substrate 30" that serves as a first substrate and has a first surface 30"a and a second surface 30"b facing each other, first connection terminals 35" and second connection terminals 33" that are provided on the first surface 30"a, and a plurality of connection wiring lines 31", that are provided on the second surface 30"b. In the first base substrate 30", through holes 34" that pass through the first base substrate 30", and the second connection terminals 33" and the connection wiring lines 31" are electrically connected through the conductive layers provided in the through holes 34". The first surface 30"a of the first base substrate 30" is a mounting surface which is mounted to the rigid substrate 30" and the second surface 30"b is a non-mounting surface. As shown in FIG. 8B, on the first surface 30"a, a plurality of first connection terminals 35" (in this modification, four) in an x axis direction 80 as a first direction, a plurality of second connection terminals 33" (in this modification, four) that are disposed on the first surface 30"a at predetermined gaps from the first connection terminals 351" in a y axis direction 90 as a second direction perpendicular to the x axis direction 80, and wiring lines 36" that are connected to the first connection terminals 35" are provided. On the second surface 30"b, a plurality of connection wiring lines 31", that overlap the first connection terminals 35" and the second connection terminals 33" in plan view, and wiring lines 32" that are connected to the connection wiring lines 31", are provided. Each of the connection wiring lines 31" has a first wide portion 31"a as a first portion, a second wide portion 31"c as a first portion, and a narrow portion 31"b as a second portion. The first wide portion 31"a substantially overlaps the second connection terminal 33", in plan view and has a planar area larger than that of the second connection terminal 33". The second wide portion 31"c substantially overlaps the first connection terminal 35" in plan view and has a planar area bigger than the first connection terminal 35". That is, the first connection terminal 35" and the second connection terminal 33" are formed to be smaller than the first wide portion 31"a and the second wide portion 31"c of the connection wiring line 31". The narrow portion 31"b is provided to have a width narrower more than those of the first connection terminal 35" and the second connection terminal 33" in the x axis direction 80. As such, by forming the first connection terminal 35", and the second connection terminal 33" smaller than the first wide portion 31"a and the second wide portion 31"c of the connection wiring line 31", the advantages described below can be obtained. When the connection wiring lines are formed on the second surface of the mounting substrate, when the amount of the deviation in the formation position of the connection wiring line due to the variation in processing conditions is negligible for the detection of the positional deviation of the wiring line, the area of the connection wiring line can be made large. For example, at the time of the inspection for a positional deviation by use of light reflection, as described above, reflected light includes only two kinds of reflected light by the connection wiring line 31" and reflected light of the third connection terminals 51 and 52, and thus the inspection for a positional deviation can be easily performed, as compared with the case in which three or more kinds of reflected light occur. Further, in this modification, the first connection terminal 35" and the second connection terminal 33" are formed to be smaller than the first wide portion 31"a and the second wide portion 31"c of the connection wiring line 31", but each of the first connection terminal 35" and the second connection terminal 33" can be made smaller than the first wide portion 31"a and the second wide portion 31"c of the connection wiring line 31", for example, by 0.05 to 0.1 mm.

<Electronic Apparatus>

Next, an electronic apparatus having the above-described liquid crystal device 1 will be described.

Figure 10:
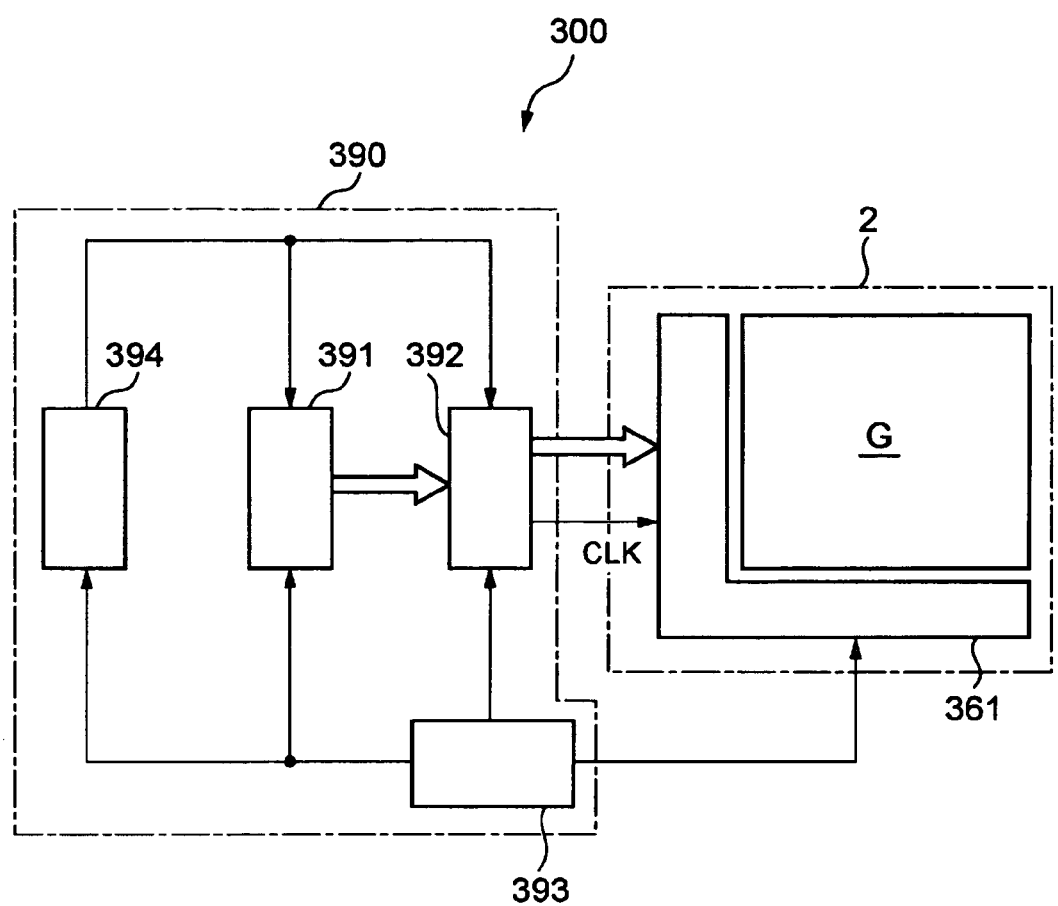
FIG. 10 is a diagram schematically showing an overall configuration of a display control system of an electronic apparatus according to an embodiment.

FIG. 10 is a diagram schematically showing the overall configuration of a display control system of an electronic apparatus according to this embodiment.

An electronic apparatus 300 is a display control system and, for example, as shown in FIG. 10, includes a liquid crystal panel 2, a display control circuit 390, and the like. The display control circuit 390 also includes a display information output source 391, a display information processing circuit 392, a power supply circuit 393, a timing generator 394, and the like.

Further, the liquid crystal panel 2 includes a driving circuit 361 for driving a display region G thereof. The driving circuit 361 corresponds to the driving IC 20 of the above-mentioned liquid crystal device 1.

The display information output source 391 includes a memory formed of a ROM (Read Only Memory), a RAM (Random Access Memory) or the like, a storage unit formed or a magnetic record disc, an optical record disc or the like, and a tuning circuit for turning and outputting a digital image signal. Further, the display information output source 391 is configured to supply display information to the display information processing circuit 392 in a form of an image signal of a predetermined format on the basis of various clock signals generated by the timing generator 394.

Further, the display information processing circuit 392 includes various well-known circuits, such as a serial-to-parallel conversion circuit, an amplification/inversion circuit, a rotation circuit, a gamma connection circuit, a clamp circuit, and the like. Further, the display information processing circuit 392 processes the inputted display information and supplies the image information to the driving circuit 361 along with a clock signal CLK. The driving circuit 361 includes a scanning line driving circuit, a data line driving circuit, and a test circuit. Further, the power supply circuit 393 supplies a predetermined voltage to each of the above-described parts.

The electronic apparatus 300 has no connection defect in the flexible wiring board and the rigid substrate, and has a good display screen.

As a specified electronic apparatus, for example, a touch panel, a projector, a liquid crystal television, a view finder-type or monitor-direct-view-type video tape recorder, a car navigation device, a pager, an electronic organizer, an electronic calculator, a word processor, a work station, a video phone, a POS terminal, or the like, on which the liquid crystal device is mounted, can be exemplified, in addition to a cellular phone, a personal computer, or the like. Of course, as display units of various electronic apparatuses, for example, the above-described liquid crystal device 1 can be adopted.

Further, the electro-optical device and the electronic apparatus of the invention are not limited to the above-described embodiments, but various modifications can be made within the scope without departing from the subject matter of the invention.

For example, the connection structure of the flexible wiring board and the rigid substrate has been described as the mounting structure provided as a part of the above-described electro-optical device, but the invention is not limited thereto. For example, the invention can be applied a connection structure of the flexible wiring board and the liquid crystal panel or to a connection structure of the flexible wiring board and the circuit board. The invention can be applied to any connection structure between two substrates. By doing so, the connection area can be reduced and the inspection of a positional deviation of the two substrates can be easily performed with the naked eye, thereby enhancing manufacturing efficiency.

Further, though the liquid crystal device is used as an example of an electro-optical device in the above-described embodiments, various electro-optical devices, such as an inorganic or organic electroluminescent display, a plasma display device, an electrophoretic display device, a device using electron emitting elements (Field Emission Display and Surface-Conduction Electron-Emitter Display), and the like can be used.

What is claimed is:
1. A mounting structure comprising:
a first substrate that is light transmissive and that has a first surface and a second surface;
a plurality of first connection terminals that are opaque and that are disposed over the first surface and aligned in a first direction;
a plurality of first wirings that are disposed over the first surface and that are connected to corresponding ones of the first connection terminals, each first wiring including a first section that extends longitudinally only in the first direction and a second section that extends longitudinally only in a second direction that is perpendicular to the first direction;
a plurality of second connection terminals that are aligned in the first direction, that are opaque, and that are disposed over the first surface at positions separated from the first connection terminals by a gap in the second direction, the second connection terminals being substantially aligned with the first connection terminals in the second direction;
a plurality of connection wiring lines that are opaque and that are disposed over the second surface, the connection wiring lines each having two first portions that overlap, in plan view, a corresponding one of the first connection terminals and a corresponding one of the second connection terminals, respectively, and a second portion connecting the two first portions to each other, the second portion having a width in the first direction narrower than widths of the first portions and of the first and second connection terminals in the first direction, each of the first portions having an area that is equal to an area of the corresponding one of the first and second connection terminals such that each of the first portions completely overlaps the corresponding one of the first and second connection terminals;
a plurality of second wirings that are disposed over the second surface, the second wirings each being connected to corresponding first portions of the connection wiring lines and including a first section that extends longitudinally only in the first direction and a second section that extends longitudinally only in the second direction, at least a portion of the first section overlapping the first section of the corresponding first wiring in plan view, the second section completely overlapping the second section of the corresponding first wiring in plan view;
a plurality of through holes that pass through the first substrate to connect the second connection terminals to corresponding first portions of corresponding connection wiring lines; and
a second substrate that is light transmissive and that has a plurality of third connection terminals, the third connection terminals being opaque and being connected to the first and second connection terminals and correspondingly overlapping the first and second connection terminals in plan view, each of the third connection terminals having an area that is equal to the area of the corresponding one of the first and second connection terminals such that each of the third connection terminals completely overlaps the corresponding one of the first and second connection terminals.
2. The mounting structure according to claim 1,
wherein the first and second substrates have light transmittance higher than those of the first connection terminals, the second connection terminals, the third connection terminals, and the connection wiring lines.

3. The mounting structure according to claim 1,
wherein the first and second connection terminals and the third connection terminals are correspondingly connected by light-transmissive conductive members.

4. A mounting structure comprising:
a first substrate that is light transmissive and that has a first surface and a second surface;
a plurality of first connection terminals that are opaque and that are disposed over the first surface and aligned in a first direction;
a plurality of first wirings that are disposed over the first surface and that are connected to corresponding ones of the first connection terminals, each first wiring including a first section that extends longitudinally only in the first direction and a second section that extends longitudinally only in a second direction that is perpendicular to the first direction;
a plurality of second connection terminals that are aligned in the first direction, that are opaque, and that are disposed over the first surface at positions separated from the first connection terminals by a gap in the second direction, the second connection terminals being substantially aligned with the first connection terminals in the second direction;
a plurality of connection wiring lines that are opaque and that are disposed over the second surface, the connection wiring lines each having two first portions that substantially overlap, in plan view, a corresponding one of the first connection terminals and a corresponding one of the second connection terminals, respectively, and are formed smaller than the first and second connection terminals in plan view, and a second portion connecting the two first portions to each other, the second portion having a width in the first direction narrower than widths of the first portions in the first direction, each of the first portions having an area that is equal to an area of the corresponding one of the first and second connection terminals such that each of the first portions completely overlaps the corresponding one of the first and second connection terminals;
a plurality of second wirings that are disposed over the second surface, the second wirings each being connected to corresponding first portions of the connection wiring lines and including a first section that extends longitudinally only in the first direction and a second section that extends longitudinally only in the second direction, at least a portion of the first section overlapping the first section of the corresponding first wiring in plan view, the second section completely overlapping the second section of the corresponding first wiring in plan view;
a plurality of through holes that pass through the first substrate to connect the second connection terminals to corresponding first portions of corresponding connection wiring lines; and
a second substrate that is light transmissive and that has a plurality of third connection terminals that are opaque, the third connection terminals being connected to the first and second connection terminals and correspondingly overlapping the first and second connection terminals in plan view, each of the third connection terminals having an area that is equal to the area of the corresponding one of the first and second connection terminals such that each of the third connection terminals completely overlaps the corresponding one of the first and second connection terminals.

5. A mounting substrate comprising:
a first substrate that is light transmissive and that has a first surface and a second surface;
a plurality of first connection terminals that are opaque and that are disposed over the first surface and aligned in a first direction;
a plurality of first wirings that are disposed over the first surface and that are connected to corresponding ones of the first connection terminals, each first wiring including a first section that extends longitudinally only in the first direction and a second section that extends longitudinally only in a second direction that is perpendicular to the first direction;
a plurality of second connection terminals that are aligned in the first direction, that are opaque, and that are disposed over the first surface at positions separated from the first connection terminals by a gap in the second direction, the second connection terminals being substantially aligned with the first connection terminals in the second direction;
a plurality of connection wiring lines that are opaque and that are disposed over the second surface, the connection wiring lines each having two first portions that overlap, in plan view, a corresponding one of the first connection terminals and a corresponding one of the second connection terminals, respectively, and a second portion connecting the two first portions to each other, the second portion having a width in the first direction narrower than widths of the first portions and of the first and second connection terminals in the first direction, each of the first portions having an area that is equal to an area of the corresponding one of the first and second connection terminals such that each of the first portions completely overlaps the corresponding one of the first and second connection terminals;
a plurality of second wirings that are disposed over the second surface, the second wirings each being connected to corresponding first portions of the connection wiring lines and including a first section that extends longitudinally only in the first direction and a second section that extends longitudinally only in the second direction, at least a portion of the first section overlapping the first section of the corresponding first wiring in plan view, the second section completely overlapping the second section of the corresponding first wiring in plan view; and
a plurality of through holes that pass through the first substrate to connect the second connection terminals to corresponding first portions of corresponding connection wiring lines.

6. A mounting substrate comprising:
a first substrate that is light transmissive and that has a first surface and a second surface;
a plurality of first connection terminals that are opaque and that are disposed over the first surface and aligned in a first direction;
a plurality of first wirings that are disposed over the first surface and that are connected to corresponding ones of the first connection terminals, each first wiring including a first section that extends longitudinally only in the first direction and a second section that extends longitudinally only in a second direction that is perpendicular to the first direction;
a plurality of second connection terminals that are opaque and that are disposed over the first surface at positions separated from the first connection terminals by a gap in the second direction, the second connection terminals being substantially aligned with the first connection terminals in the second direction;

a plurality of connection wiring lines that are opaque and that are disposed over the second surface, the connection wiring lines each having two first portions that substantially overlap, in plan view, a corresponding one of the first connection terminals and a corresponding one of the second connection terminals, respectively, and are formed smaller than the first and second connection terminals in plan view, and a second portion connecting the two first portions to each other, the second portion having a width in the first direction narrower than widths of the first portions in the first direction, each of the first portions having an area that is equal to an area of the corresponding one of the first and second connection terminals such that each of the first portions completely overlaps the corresponding one of the first and second connection terminals;

a plurality of second wirings that are disposed over the second surface, the second wirings each being connected to corresponding first portions of the connection wiring lines and including a first section that extends longitudinally only in the first direction and a second section that extends longitudinally only in the second direction, at least a portion of the first section overlapping the first section of the corresponding first wiring in plan view, the second section completely overlapping the second section of the corresponding first wiring in plan view; and a plurality of through holes that passes through the first substrate to connect the second connection terminals to corresponding first portions of corresponding connection wiring lines.

7. An electro-optical device comprising:

an electro-optical material;

a substrate for an electro-optical device that holds the electro-optical material;

a first substrate that is light transmissive and that has a first surface and a second surface and is electrically connected to the substrate for an electro-optical device;

a plurality of first connection terminals that are opaque and that are disposed over the first surface and aligned in a first direction;

a plurality of first wirings that are disposed over the first surface and that are connected to corresponding ones of the first connection terminals, each first wiring including a first section that extends longitudinally only in the first direction and a second section that extends longitudinally only in a second direction that is perpendicular to the first direction;

a plurality of second connection terminals that are aligned in the first direction, that are opaque, and that are disposed over the first surface at positions separated from the first connection terminals by a gap in the second direction, the second connection terminals being substantially aligned with the first connection terminals in the second direction;

a plurality of connection wiring lines that are opaque and that are disposed over the second surface, the connection wiring lines each having two first portions that overlap, in plan view, a corresponding one of the first connection terminals and a corresponding one of the second connection terminals, respectively, and a second portion connecting the two first portions to each other, the second portion having a width in the first direction narrower than widths of the first portions and of the first and second connection terminals in the first direction, each of the first portions having an area that is equal to an area of the corresponding one of the first and second connection terminals such that each of the first portions completely overlaps the corresponding one of the first and second connection terminals;

a plurality of second wirings that are disposed over the second surface, the second wirings each being connected to corresponding first portions of the connection wiring lines and including a first section that extends longitudinally only in the first direction and a second section that extends longitudinally only in the second direction, at least a portion of the first section overlapping the first section of the corresponding first wiring in plan view, the second section completely overlapping the second section of the corresponding first wiring in plan view;

a plurality of through holes that pass through the first substrate to connect the second connection terminals to corresponding first portions of corresponding connection wiring lines; and a second substrate that is light transmissive and that has a plurality of third connection terminals that are opaque, the third connection terminals being connected to the first and second connection terminals and correspondingly overlapping the first and second connection terminals in plan view, each of the third connection terminals having an area that is equal to the area of the corresponding one of the first and second connection terminals such that each of the third connection terminals completely overlaps the corresponding one of the first and second connection terminals.

8. An electronic apparatus comprising the electro-optical device according to claim 7.

* * * * *